(12) United States Patent
Kamada et al.

(10) Patent No.: US 8,084,794 B2
(45) Date of Patent: Dec. 27, 2011

(54) SEMICONDUCTOR DEVICE AND MANUFACTURING METHOD THEREOF

(75) Inventors: Yoichi Kamada, Kawasaki (JP); Naoya Okamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 201 days.

(21) Appl. No.: 12/540,952

(22) Filed: Aug. 13, 2009

(65) Prior Publication Data

US 2010/0052176 A1  Mar. 4, 2010

(30) Foreign Application Priority Data

Aug. 29, 2008 (JP) ................. 2008-221412

(51) Int. Cl.
*H01L 23/48* (2006.01)
(52) U.S. Cl. . 257/276; 257/522; 257/763; 257/E21.641; 438/319; 438/421
(58) Field of Classification Search ........................ None
See application file for complete search history.

(56) References Cited

U.S. PATENT DOCUMENTS

| 6,104,917 | A | * | 8/2000 | Ketonen | 455/117 |
| 2001/0048459 | A1 | * | 12/2001 | Sakai et al. | 347/233 |
| 2007/0102727 | A1 | | 5/2007 | Twynam | |
| 2007/0114606 | A1 | * | 5/2007 | Hoshino et al. | 257/341 |
| 2008/0142989 | A1 | * | 6/2008 | Hayashi et al. | 257/774 |

FOREIGN PATENT DOCUMENTS

| JP | 2003-197740 A | 7/2003 |
| JP | 2007-150282 A | 6/2007 |

* cited by examiner

*Primary Examiner* — Evan Pert
*Assistant Examiner* — Scott R Wilson
(74) *Attorney, Agent, or Firm* — Westerman, Hattori, Daniels & Adrian, LLP

(57) ABSTRACT

A semiconductor device includes a first wiring extending in a first direction and a second wiring extending in a second direction which crosses the first direction and being disposed with a space interposed between the first wiring and the second wiring, and including a tantalum layer, a tantalum nitride layer formed over the tantalum layer, and a metal layer formed over the tantalum nitride layer.

20 Claims, 18 Drawing Sheets

US 8,084,794 B2

SEMICONDUCTOR DEVICE AND MANUFACTURING METHOD THEREOF

CROSS REFERENCE TO RELATED APPLICATION

This application is based upon and claims the benefit of priority from prior Japanese Patent Application No. 2008-221412, filed on Aug. 29, 2008, the entire contents of which are incorporated herein by reference.

FIELD

The present invention relates to a semiconductor device and a manufacturing method thereof.

BACKGROUND

It is desirable that semiconductor devices, for example field effect transistors for power amplification, be miniaturized so that such semiconductor devices may be manufactured at lower costs.

However, a distance between wirings, more specifically the distance between the wirings which intersect with each other with an insulation film interposed between the wirings, may be narrowed due to the miniaturization of the semiconductor device. Such narrowing between the wirings causes a larger parasitic capacitance between the wirings and makes a high frequency operation difficult in the semiconductor device.

An air-bridge wiring has been effectively used to reduce the parasitic capacitance between wirings intersecting with each other with the insulation film interposed between the wirings. Especially, the air-bridge wirings are effective in achieving high speed operations of the field effect transistors for power amplification in which a number of field effect transistors (FETs), called a "multi-gate transistor," are provided over the same semiconductor substrate.

FETs are arranged in one line, and terminals (sources, drains, and gates) are coupled to other corresponding terminals by comb-shaped electrodes to form the multi-gate transistor. In such a multi-gate transistor, intersections are inevitably formed at locations where source electrodes are coupled with a plurality of sources and gate electrodes are coupled with a plurality of gates.

To avoid contact of a gate electrode and a source electrode, a bridge wiring structure is provided at the intersection. The bridge wiring structure is a structure where one electrode crosses over the other electrode with an overhead crossing with an insulation film being interposed between both electrodes (For example, see Japanese Laid-Open Patent Application 2003-197740.).

The parasitic capacitance becomes greater in the bridge wiring structure due to a high dielectric constant of the insulation film provided between the crossing wirings. In consequence, air-bridge wirings where the crossing wirings are separated by a space are used in achieving the high-speed operations of the multi-gate transistor.

Gold (Au) having a high electric conductivity is widely used as a metal layer that forms the air-bridge wiring. However, gold is a soft metal and maintaining the air-bridge structure is difficult for gold alone. Consequently, a laminated structure that includes titanium (Ti) and platinum (Pt) is used as a support body to form a Ti/Pt/Au laminated structure, and the air-bridge wiring is formed. Here, Ti is used to achieve better adhesion between the substrate and the air-bridge layer, and the Au layer is supported by a Pt layer (For example, see Japanese Laid-Open Patent Application 2007-150282.).

In recent years, high electron mobility transistors (HEMT) in which channel layers are formed of gallium nitride (GaN) have been attracting much attention as a high frequency and high output transistors (Hereinafter, a HEMT whose channel layer is formed of gallium nitride (GaN) is referred to as a "GaN-HEMT".).

Since the band gap of GaN is wider in comparison with those of Si and GaAs, the GaN-HEMT is suitable for operations under high temperatures. Moreover, since the breakdown voltage of the GaN-HEMT is high, the GaN-HEMT is suitable for operations at high voltages. Consequently, GaN-HEMTs may have fewer malfunctions due to an increase in operation temperature or an increase in electrical field, even when the GaN-HEMTs are miniaturized and operated under a large current.

For this reason, multi-gate transistors which include GaN-HEMTs are used as high frequency/high output power amplifiers.

SUMMARY

Accordingly, it is an object of an aspect of the invention to provide a semiconductor device including a first wiring extending in a first direction and a second wiring extending in a second direction which crosses the first direction and being disposed with a space interposed between the first wiring and the second wiring, and including a tantalum layer, a tantalum nitride layer formed over the tantalum layer, and a metal layer formed over the tantalum nitride layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

An air-bridge wiring capable of reducing a parasitic capacitance is used in forming a multi-gate transistor with FETs suitable for high frequency operations. Here, a large current is caused to flow through the air-bridge wiring when the multi-gate transistor is formed with FETs, such as a GaN-HEMT, that operate with the large current. In consideration of the facts disclosed above, the inventor studied what might occur when an output of a multi-gate transistor that includes a plurality of GaN-HEMTs (hereinafter, referred to as a "GaN-HEMT multi-gate transistor") was made higher.

The study revealed that the large current flowing through the air-bridge wiring might cause electromigration of Au forming the air-bridge wiring, and Au might enter grain boundaries of a Pt support layer. In the above case, collapse of the Pt support layer may occur, and since the air-bridge wiring loses its support body, and this may result in wiring disconnection.

Hereinafter, embodiments of the present invention will be disclosed with reference to the accompanying drawings. It should be noted that the scope of the present invention is not limited to the embodiments hereinafter disclosed.

The main body of the air-bridge wiring is a thick Au layer if the air-bridge wiring is formed of a Ti/Pt/Au laminated structure. Since Au is a soft metal, the Au layer alone may not fully maintain an air-bridge structure. Consequently, a Pt layer formed under the Au layer supports the Au layer.

Meanwhile, it is well known that Au has a tendency to cause electromigration. For the above reason, Au atoms ejected by an electron flow may migrate into a Pt film from the Au layer, and the migration may cause the collapse of the Pt film when the multi-gate transistor is operated under a large current, for example, equal to or more than $1 \times 10^5$ A/cm$^2$.

Figure 1:
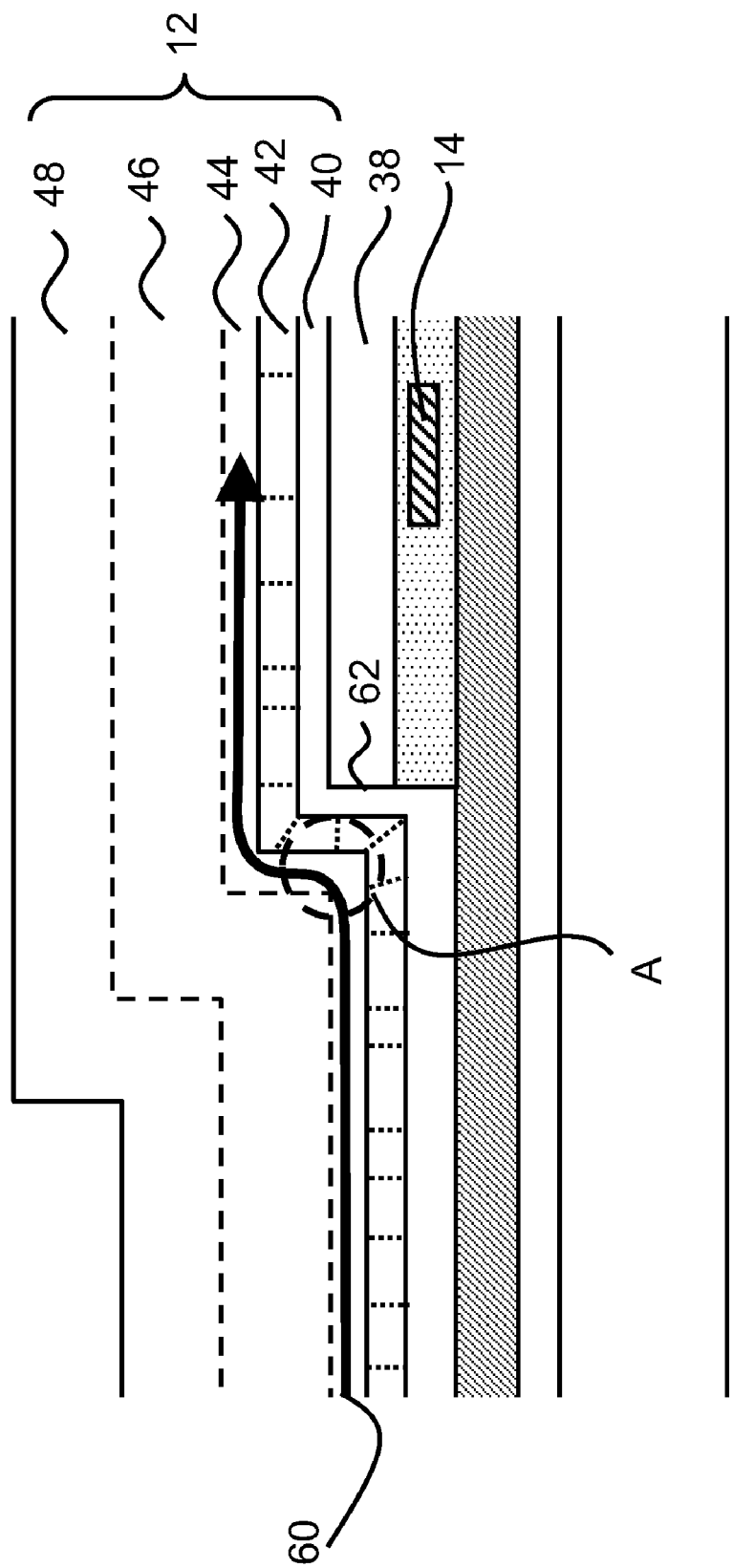
FIG. 1 illustrates an enlarged view of a left side end of a Ti/Pt/Au air-bridge wiring.
Figure 2:
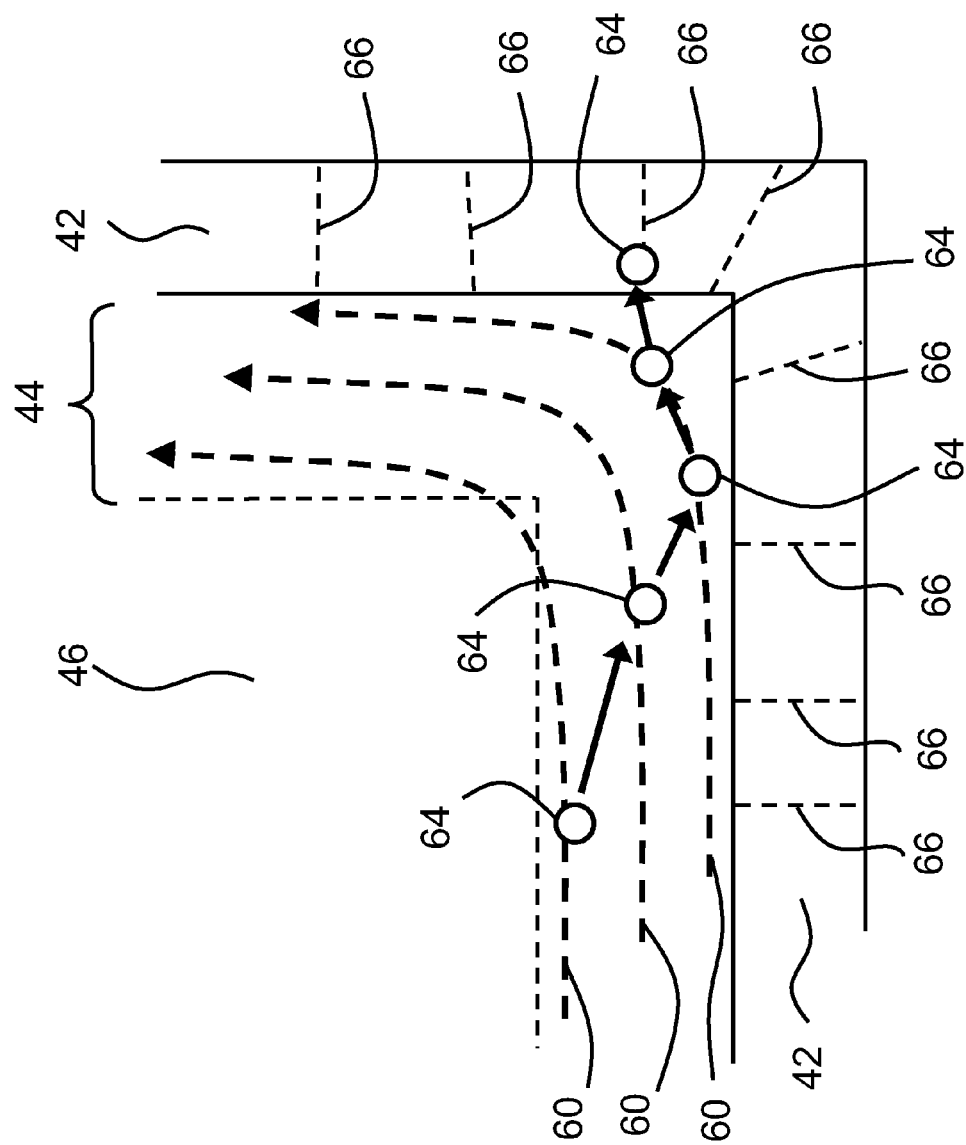
FIG. 2 illustrates an enlarged view of the area A circled by the dotted line in FIG. 1.

FIG. 1 is a view that explains electromigration. FIG. 2 is a view where an area "A" circled by the dotted line in FIG. 1 is enlarged.

FIG. 1 illustrates a left side end of an air-bridge wiring 12. Here, the air-bridge wiring 12 is formed over a common electrode 14 coupled to a plurality of gates of the multi-gate transistor with a space 38 being interposed between the air-bridge wiring 12 and the common electrode 14. In addition, the air-bridge wiring 12 is formed by laminating a Ti layer 40, a Pt layer 42, a first Au layer 44, a second Au layer 46, and a third Au layer 48.

As illustrated in FIG. 1, an electron flow 60 passing through the air-bridge wiring 12 moves straight ahead in the vicinity of an inner wall 62 of the air-bridge wiring 12, and thereafter, the electron flow 60 changes direction (Note that FIG. 1 illustrates the electron flow flowing along the bottom of the air-bridge wiring 12.). Consequently, as illustrated in FIG. 2, Au atoms 64 of the first to the third Au layers 44, 46, and 48, which collide with the electron flow 60 and are dispersed, migrate toward the Pt layer 42 (in other words, conduct electromigration.).

On the other hand, a large number of grain boundaries 66 extending in a growth direction exist in the Pt layer 42. The Au atoms 64 migrating toward the Pt layer 42 enter the grain boundaries 66 and try to break the bonds between microcrystals of Pt.

As a result, the Pt layer 42 may collapse, and the Pt layer 42 may be unable to support the air-bridge wiring 12. Consequently, it may be assumed that the air-bridge wiring 12 that loses its support body may become disconnected.

Note that although the air-bridge wiring 12 illustrated in FIGS. 1 and 2 bends at a right angle, it is assumed that similar phenomena may occur and result in the disconnection of the air-bridge wiring 12 even in cases where the air-bridge wiring 12 bends at lesser angles.

Metal atoms exposed to the electron flow strongly oscillate due to repeated collisions with electrons and, as a result, the metal atoms migrate from lattice points that bind the metal atoms. Although the directions of the migration of individual metal atoms are not constant at this point of time, many of the metal atoms, as a group, migrate toward a downstream side of the electron flow. Such a migration phenomenon of the metal atoms is referred to as "electromigration."

Oscillation of the metal atoms that induces the electromigration is similar to oscillations of metal atoms heated at high temperatures. Therefore, it is assumed that metals stable at high temperatures, in other words metals with high melting points, may have a high electromigration resistance.

The inventor studied the electromigration resistance of $Ta_{1-x}N_x$ (0≦x<1) that is a high-melting-point metal capable of being used as the air-bridge wiring 12.

The electromigration resistance was studied based on the accelerated thermal degradation test in which metal films under test were heated and the rates of degradation of the heated metals were measured. The test may create a state that is similar to the state in which metal atoms are exposed to the electron flow and strongly oscillated, by exposing the metal films under test to high temperatures.

The following experiments were conducted. A specimen (Ti/$Ta_{1-x}N_x$/Au laminated film, 0≦x<1) was created by forming a Ti/Al laminated film in which an Al layer was laminated over a Ti layer; and a Ti layer, a $Ta_{1-x}N_x$ layer (0≦x<1), and an Au layer were laminated in order over the Ti/AL laminated film. Furthermore, a comparison specimen (Ti/Pt/Au laminated film) was created by laminating a Ti layer, a Pt layer, and an Au layer, in order, over the Ti/Al laminated film.

Here, the $Ta_{1-x}N_x$ layer is formed by a reactive sputtering method in which Ta is used as a target. A sputter gas and a reactive gas may be, for example, Ar and $N_2$, respectively. The Au layer and the Pt layer are formed by the sputtering method in which Au and Pt are used as targets, respectively. A sputter gas used here may be, for example, Ar.

Here, the thicknesses of the Ti layer, the $Ta_{1-x}N_x$ layer, and the Au layer may be, for example, several tens of nanometers (nm), 200 nm, and 50 nm to 300 nm, respectively. On the other hand, the thickness of the Pt layer of the comparison specimen is, for example, 200 nm that is similar to, if not the same as, the $Ta_{1-x}N_x$ layer. Note that the thicknesses of the Al layer and the Ti layer are similar, if not the same, in all the specimens.

The specimens formed in the manner disclosed above were heated up to 450° C. and the time until changes appear on the surface of the Au layer was measured. Here, the thickness of the Au layer is configured so that the changes may easily appear on the surface of the Au layer.

The surfaces of the specimens were uniform and without characteristics before the specimen is heated. When, however, the specimen was continuously heated, eventually spots appeared on the surface of the specimen. Heating times (hereinafter, referred to as a "reaction time") until the spots appear were measured and compared.

The spots were considered to be an AlAu alloy generated by the Au atoms that broke the $Ta_{1-x}N_x$ layer (or the Pt layer) and reacted with the Al film provided under the $Ta_{1-x}N_x$ layer (or the Pt layer). That is to say, the reaction time measured based on the accelerated thermal degradation test represents the time taken for the strongly oscillating Au atoms to damage the $Ta_{1-x}N_x$ layer (or the Pt layer). Hence, it is assumed that longer the reaction time of a metal film, the higher the electromigration resistance of the metal film.

Figure 3:
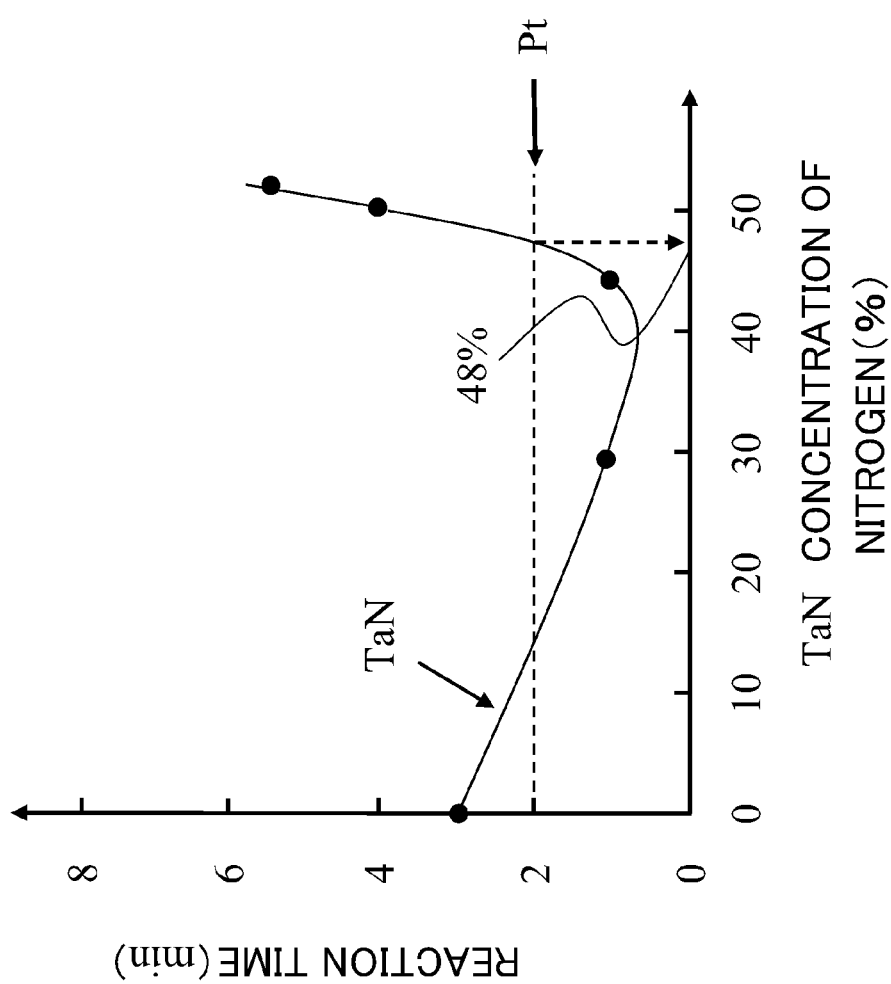
FIG. 3 is a graph representing relationships between concentrations of nitrogen in TaN and reaction times.

FIG. 3 is a graph that represents the measurement results of the reaction times, where the composition of the $Ta_{1-x}N_x$ layer is varied. The horizontal axis of the graph represents a concentration of nitrogen in the $Ta_{1-x}N_x$ layer. The vertical axis thereof represents the reaction time. The curved line "TaN" represents the reaction time of the specimen that has the $Ti/Ta_{1-x}N_x$ laminated film formed between the Ti/Al laminated film and the Au layer. On the other hand, the dotted line "Pt" represents the reaction time (approximately 2 minutes) of the specimen where a Ti/Pt laminated film is formed between the Ti/Al laminated film and the Au layer. Here, since the $Ti/Ta_{1-x}N_x$ laminated film and the Ti/Pt laminated film both include a Ti layer, the Ti layer does not cause a difference between reaction times of either of the specimens.

As represented by the graph of FIG. 3, the reaction time (approximately 3 minutes) of the specimen where the concentration of nitrogen is substantially 0%, in other words, the specimen in which the Ta layer is formed, was longer than the reaction time (approximately 2 minutes) of the specimen in which the Pt layer is formed. However, according to the increase in the concentration of nitrogen, the reaction time of the $Ta_{1-x}N_x$ layer became shorter, and the reaction time of the $Ta_{1-x}N_x$ layer became shorter than that of the comparison specimen. Then, the reaction time is shortest in the vicinity of 40% of concentration of nitrogen.

The reaction time of the $Ta_{1-x}N_x$ layer rapidly increased according to the increase in the concentration of nitrogen. The reaction time became substantially equal to that of the comparison specimen when the concentration of nitrogen became approximately 48%.

Then, the reaction time of the $Ta_{1-x}N_x$ layer became substantially twice as long as that of the comparison specimen when the concentration of nitrogen was approximately 50%. The reaction time continued to increase thereafter. Here, it may be difficult to create a specimen whose concentration of nitrogen is higher than approximately 52% by the sputtering method.

The results disclosed above reveal that forming an air-bridge wiring with the Ti/TaN/Au laminated film supported by TaN whose concentration of nitrogen is not less than approximately 48% allows formation of an air-bridge wiring with higher electromigration resistance.

For this reason, the inventor experimentally created a multi-gate transistor provided with air-bridge wirings formed of the Ti/TaN/Au laminated film. Hereinafter, a manufacturing process of the air-bridge wirings will be disclosed.

Figure 4:
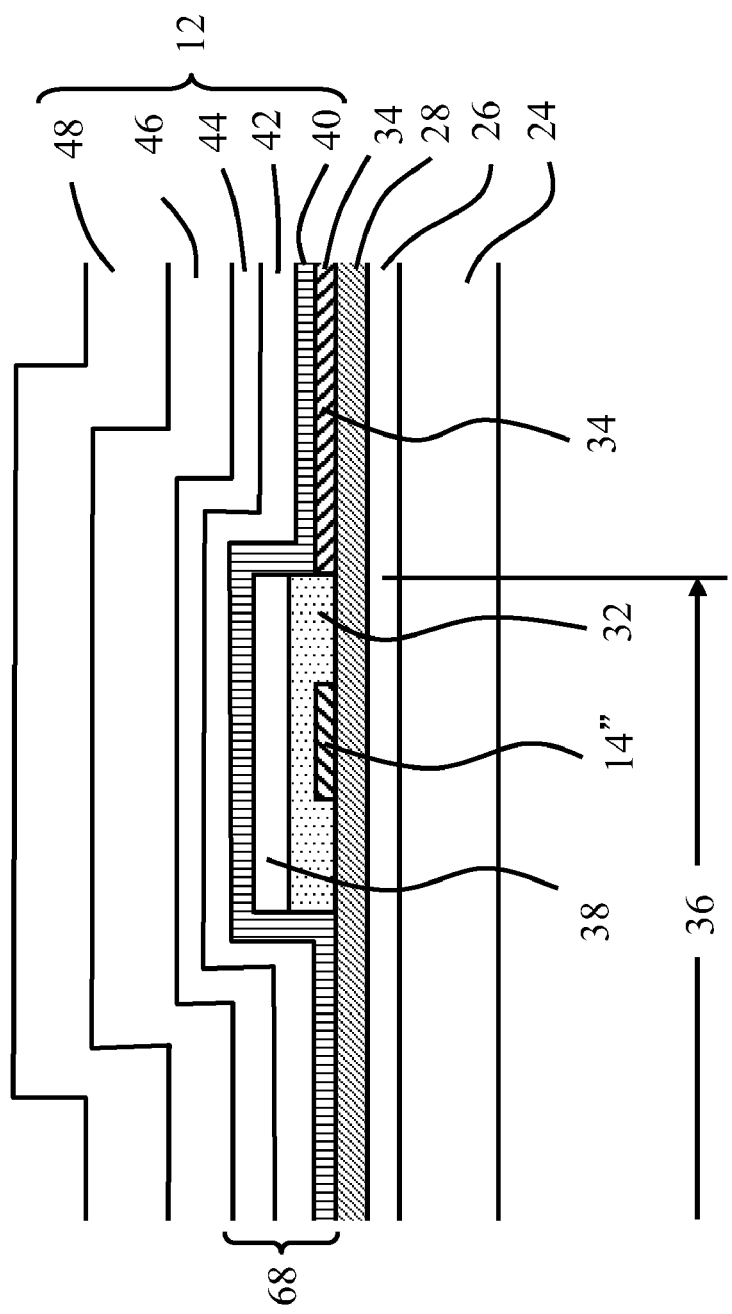
FIG. 4 illustrates a cross sectional view of a Ti/TaN/Au air-bridge wiring.

FIG. 4 illustrates a cross sectional view of an air-bridge wiring structure of the multi-gate transistor that was used in the experiments. In the multi-gate transistor, a source electrode crosses over a gate electrode with an overhead crossing.

A common electrode 14" that forms a gate electrode is formed over an AlGaN inactive region 36 caused to have a high resistance by ion implantation into an n-type AlGaN carrier supply layer 28. In addition, an air-bridge wiring 12 (the source electrode) crosses over the common electrode 14" (the gate electrode), which is covered with a protection film 32, with a space 38 being interposed between the common electrode 14" and the air-bridge wiring 12.

Here, the air-bridge wiring 12 includes a Ti layer 40, a TaN layer 42, a first Au layer 44, a second Au layer 46, and a third Au layer 48.

Next, the manufacturing process of the air-bridge wiring structure in the experimentally created multi-gate transistor will be disclosed.

Figure 5A:
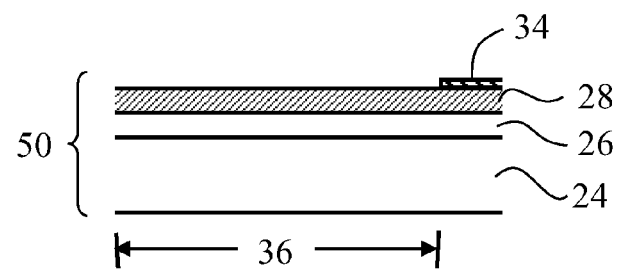
FIGS. 5A to 5H illustrate cross sectional views of a manufacturing process of the Ti/TaN/Au air-bridge wiring.

First, an unintentionally doped-GaN (UID-GaN) channel layer 26, the n-type AlGaN carrier supply layer 28, a UID-GaN cap layer (not shown) are laminated in turn over an SiC substrate 24, and a substrate 50 with an ohmic electrode 34 being formed thereover is prepared (see FIG. 5A).

Here, the ohmic electrode 34 is formed over a semiconductor region intended for the source and the drain. Moreover, the UID-GaN cap layer is removed except for a semiconductor region for a channel (therefore not shown in FIG. 5A). In addition, the n-type AlGaN carrier supply layer 28 exposed over an area for forming the common electrode 14" is caused to have a high resistance by the ion implantation, and the n-type AlGaN carrier supply layer 28 becomes the AlGaN inactive region 36.

Figure 5B:
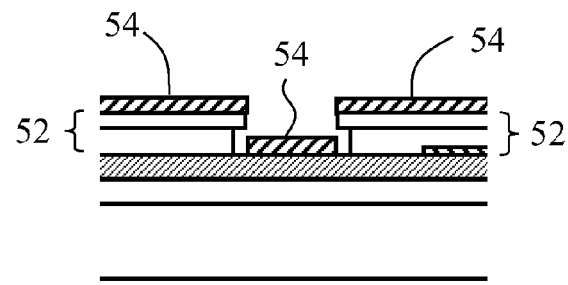

Next, a photo-resist film 52 for lift-off is formed over the substrate 50. Thereafter, a Ni/Au laminated film 54 for the gate electrode is deposited (see FIG. 5B). Then, the photo-resist film 52 for lift-off is removed, and a gate electrode 22 is formed. The Ni/Au laminated film 54 forms a Schottky barrier on the UID-GaN cap layer.

Figure 5C:
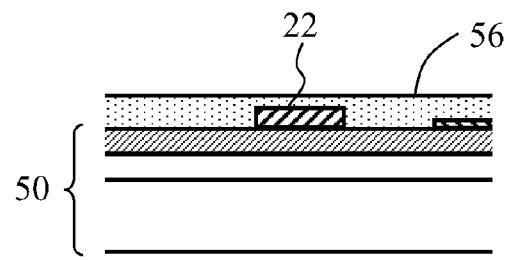

Then, an SiN film 56 having a thickness of approximately 500 nm and intended for a protection film is deposited over the substrate 50 (see FIG. 5C).

Figure 5D:
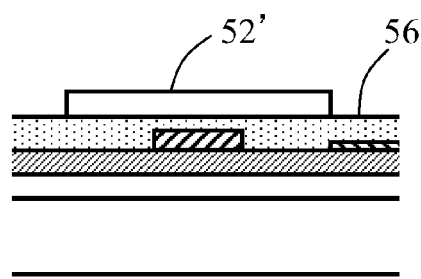
Figure 5E:
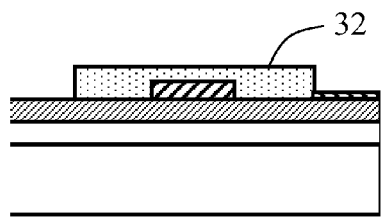

Then, a photo-resist film 52' is formed over an area for forming the protection film 32 (see FIG. 5D). The SiN film 56 is removed by dry etching in which the photo-resist film 52' is used as an etching mask and the protection film 32 is formed (see FIG. 5E).

Figure 5F:
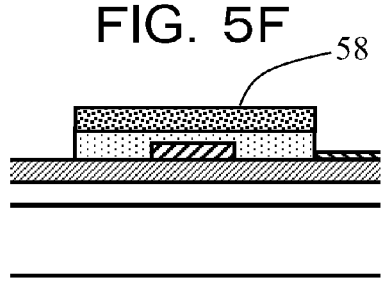

Then, a photo-resist film (a mask) 58 for air-bridge formation is formed over the protection film 32 at a location where an intersection of the gate electrode and the source electrode is to be located (see FIG. 5F).

Figure 5G:
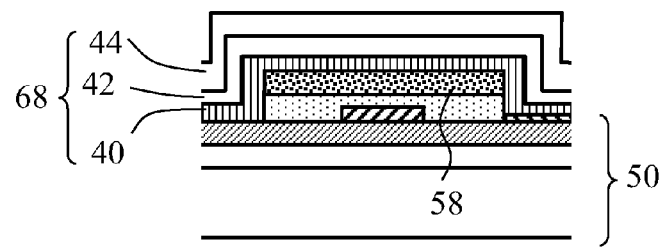

Then, the Ti layer 40 having a thickness of, for example, approximately 10 nm, the TaN layer 42 having a thickness of, for example, approximately 200 nm, and the first Au layer 44 having a thickness of, for example, approximately 50 nm are deposited in turn over the substrate 50 by, for example, the sputtering method (see FIG. 5G). For example, the Ti layer 40 and the first Au layer 44 may be deposited by the sputtering method in which Ti and Au are used as targets. A sputter gas may be, for example, Ar. In addition, for example, TaN may be deposited by a reactive sputtering method in which Ta is used as a target. Here, a reactive gas may be, for example, $N_2$.

Then, the second and the third Au layers 46 and 48 are formed thickly by electrolytic plating with the first Au layer 44 as a seed film and a photo-resist film (not shown), which has openings for forming a source electrode and a drain electrode, as a plating mask. The combined thickness of the second and the third Au layers 46 and 48 may be, for example, 1 μm to 2 μm.

Thereafter, the plating mask is removed, and a sputter film being exposed in between respective electrodes is removed by milling.

Figure 5H:
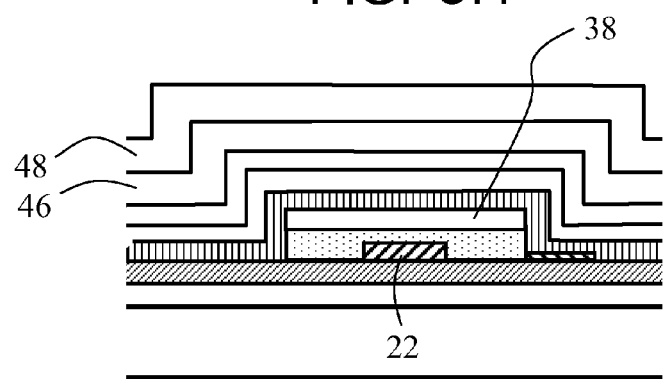

The photo-resist mask 58 for air-bridge formation is removed, for example, with a microwave asher in which the reaction gas may be, for example, oxygen, and a multi-gate transistor 2 is formed (see FIG. 5H).

As result of experimentally creating the multi-gate transistor disclosed above, there is a possibility that the space 38, which separates a Ti/TaN/Au sputter film 68 and the gate electrode 22, is not formed due to the melting of the photo-resist film 58 for air-bridge formation in the process of the Ti/TaN/Au sputter film 68 deposition.

Consequently, the inventor measured a rise in substrate temperature during the deposition of the TaN layer. As a result of measurement, it was revealed that the substrate temperature may exceed approximately 150° C., which is the melting temperature of the photo-resist.

Such rise in temperature results from the heat of reaction of Ta sputtered from a Ta target and nitrogen gas.

It is expected that use of the Ti/TaN/Au laminated film allows formation of the air-bridge wirings with high electromigration resistance. However, due to the rise in substrate temperature during the TaN deposition, it may be difficult to form the air-bridge wirings.

First Embodiment

Reducing the thickness of the TaN layer to be formed may suppress the rise in the substrate temperature associated with the deposition of a TaN layer. This is because the time in which the substrate 50 is exposed to the heat of reaction of TaN is shortened. However, a metal layer having a certain amount of film thickness (for example, 100 nm to 200 nm) is desirable to stably support an Au layer (the first to third Au layers 44, 46, and 48). Therefore, reducing the TaN layer results in the degradation of the strength of air-bridge wirings.

As a result of various studies made by the inventor, it was revealed that formation of a Ta/TaN laminated film where the TaN layer was laminated over a Ta layer reduced the rise in substrate temperature in comparison to a case where a TaN film having a substantially equal film thickness is formed.

In the above case, since the time in which the substrate is exposed to the heat of reaction of TaN is shortened, the rise in the substrate temperature may be reduced. Furthermore, the inventor also revealed that electromigration resistance of the Ta/TaN laminated film was higher than that of the TaN film, as disclosed hereinafter. In consequence, the inventor manufactured a multi-gate transistor by using the air-bridge wirings formed of a Ti/Ta/TaN/Au laminated film.

(1) Structure

Figure 6:
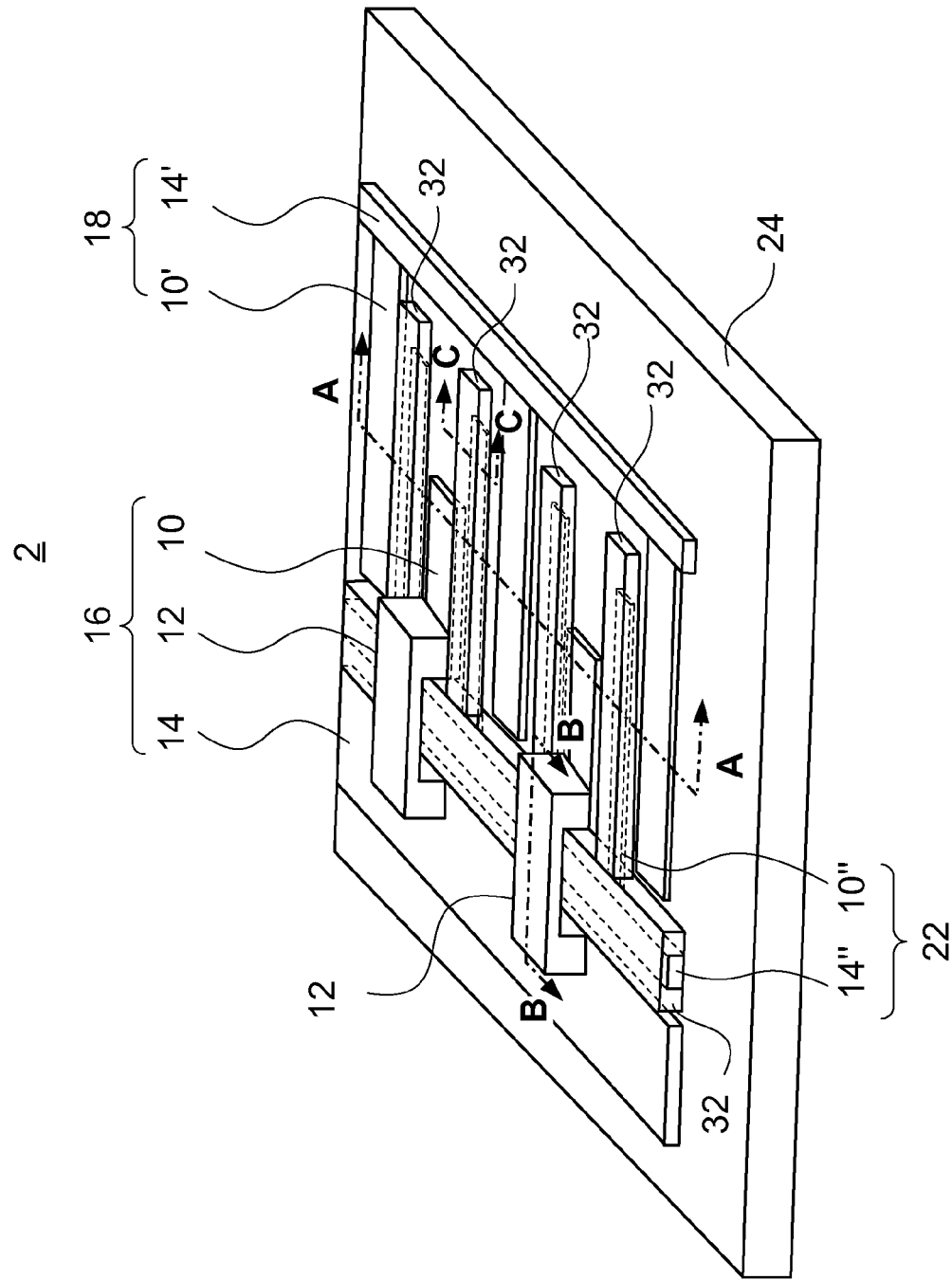
FIG. 6 illustrates a structural perspective view of a multi-gate transistor according to a first embodiment.
Figure 7:
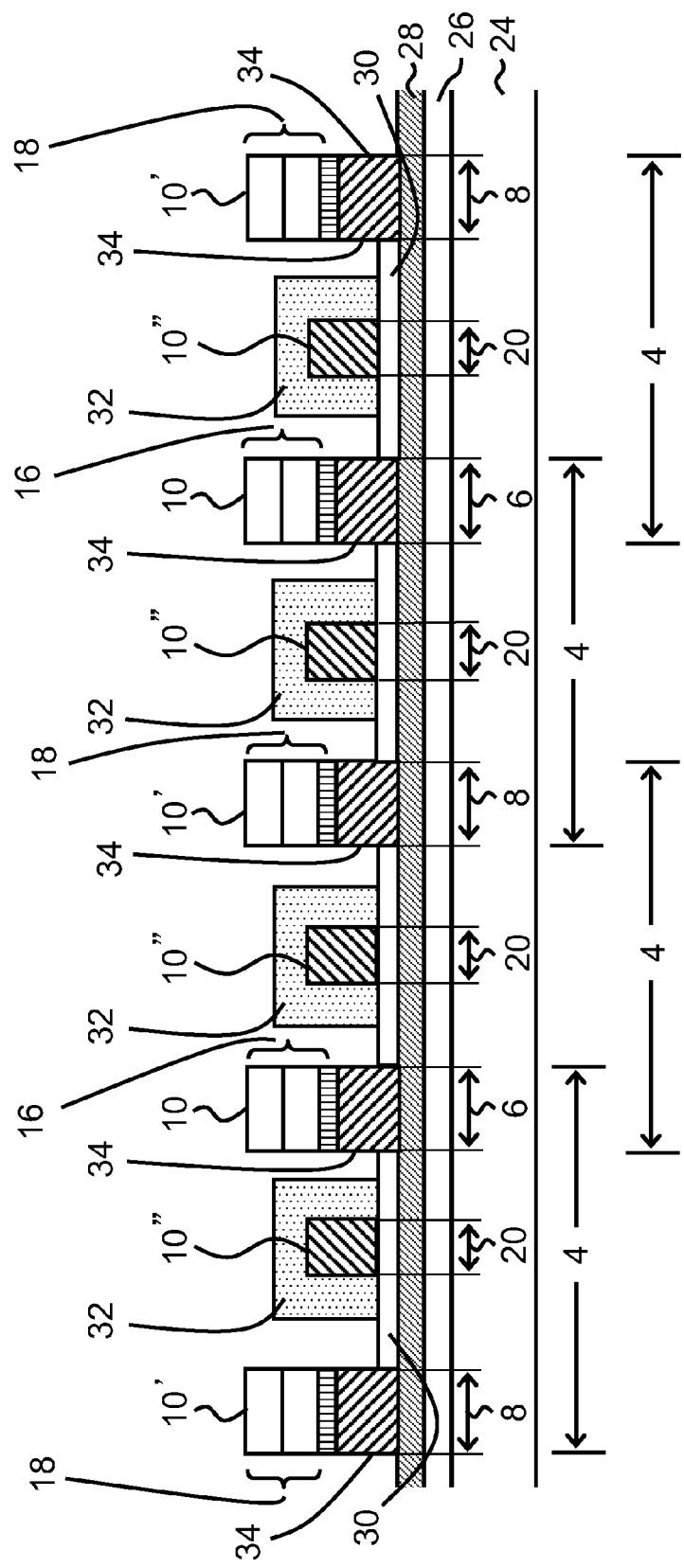
FIG. 7 illustrates a cross sectional view of the multi-gate transistor along the line A-A in FIG. 6.

FIG. 6 illustrates a perspective view of a multi-gate transistor according to a first embodiment. FIG. 7 illustrates a cross sectional view that is viewed along the line A-A in FIG. 6 from the direction shown by the arrows.

Figure 8:
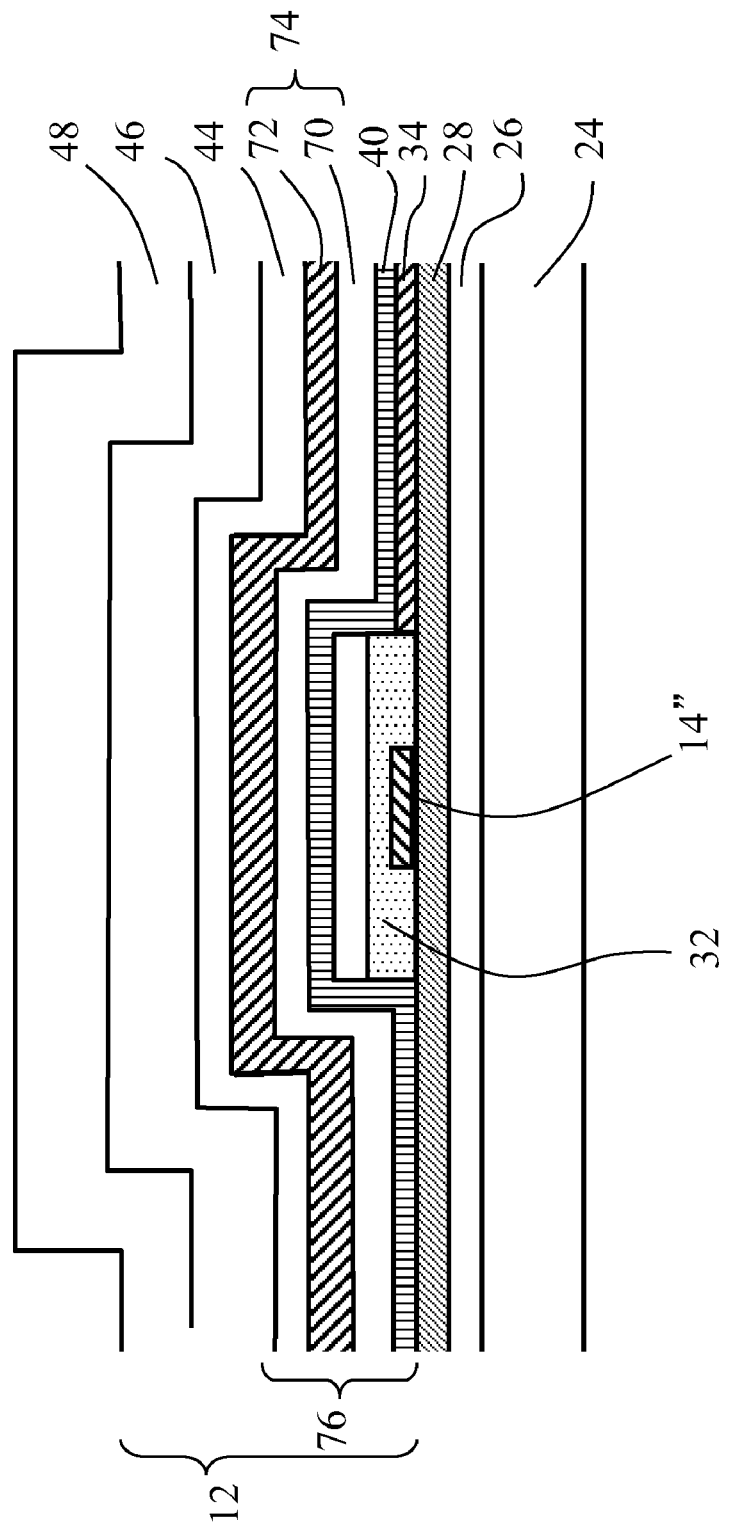
FIG. 8 illustrates a cross sectional view of the multi-gate transistor along the line B-B in FIG. 6.

FIG. 8 illustrates a cross sectional view that is viewed along the line B-B in FIG. 6 from the direction shown by the arrows.

A multi-gate transistor 2 according to the first embodiment has a structure in which four (4) GaN-HEMTs 4 are arranged in a line. Each of the GaN-HEMTs 4 adjacent to one another shares one semiconductor region as a source 6 or a drain 8 (see FIG. 7). One electrode 10 and another electrode 10' are formed over each semiconductor region.

Moreover, two electrodes 10 formed over the sources 6 are coupled to one common electrode 14 through two air-bridge wirings 12, and a comb-shaped source electrode 16 are formed (shown in FIG. 6).

Also, three electrodes 10' formed over the drains 8 are coupled to the one common electrode 14' illustrated in FIG. 6, and a comb-shaped drain electrode 18 is formed. Moreover, four electrodes 10" that are each formed over a channel and serve as gates 20 are coupled to one common electrode 14", and a comb-shaped gate electrode 22 illustrated in FIG. 6 is formed.

As disclosed above, if the three types of comb-shaped electrodes are formed in one location, it may be inevitable that two electrodes, for example, the gate electrode 22 and the source electrode 16 cross each other (see FIG. 6).

For this reason, to avoid contact between electrodes, an air-bridge wiring structure is formed at an intersecting location where one electrode crosses over the other electrode, with a space being interposed between the electrodes, with an overhead crossing.

The common electrodes 14, 14', and 14" may be used as coupling pads to external circuits. Consequently, the source electrode 16, the drain electrode 18, and a gate electrode 22 function as so-called "electrodes." On the other hand, since the source electrode 16, the drain electrode 18, and the gate electrode 22 are provided to secure paths for electrical signals input and output to and from respective GaN-HEMT terminals (sources, drains, and gates), the source electrode 16, the drain electrode 18, and the gate electrode 22 also function as "wirings." That is to say, although the source electrode 16, the drain electrode 18, and the gate electrode 22 are called "electrodes", the source electrode 16, the drain electrode 18, and the gate electrode 22 may also be used as wirings.

Here, a structure of the multi-gate transistor 2 will be disclosed.

As illustrated in FIG. 7, the multi-gate transistor 2 according to the first embodiment has a structure in which an unintentionally doped-GaN (UID-GaN) channel layer 26 is laminated over a SiC substrate 24. Moreover, an n-type AlGaN carrier supply layer 28 and a UID-GaN cap layer 30 are laminated over the UID-GaN channel layer 26 in turn, according to the first embodiment.

In addition, Ti/Al ohmic electrodes 34 where aluminum (Al) is laminated over Ti are formed over the n-type AlGaN carrier supply layer 28. Moreover, either the electrodes 10 that form the source electrodes 16 or the electrodes 10' that form the drain electrodes 18 are formed over the ohmic electrodes 34. Furthermore, the electrodes 10" that form the gate electrodes 22 are formed over the UID-GaN cap layers 30 laminated over the UID-GaN channel layer 26 which serve as the channels.

Moreover, the gate electrode 22 in FIG. 6 (the electrodes 10") is covered with a protection film 32 made of, for example, silicon nitride (SiN). The protection film 32 protects the gate electrode 22 from contamination by dust and reduces if not prevents degradation of output signals (drain current waveforms).

FIG. 8 illustrates a cross sectional view that is viewed along the line B-B in FIG. 6 from the direction shown by the arrows. That is to say, FIG. 8 illustrates a cross sectional view of the air-bridge wiring structure where the source electrode 16 crosses over the gate electrode 22 with an overhead crossing.

The common electrode 14" that forms the gate electrode 22 is formed over an AlGaN inactive region where ion implantation causes the n-type AlGaN carrier supply layer 28 to have a high resistance. In addition, an air-bridge wiring 12 (that is to say, the source electrode 16) crosses over the common electrode 14" (that is to say, the gate electrode 22) covered with the protection film 32, with a space being interposed between the air-bridge wiring 12 and the common electrode 14".

Here, the air-bridge wiring 12 is formed by laminating a Ti layer 40, a Ta layer 70, a TaN layer 72, a first Au layer 44, a second Au layer 46, and a third Au layer 48 A concentration of nitrogen in TaN is, for example, approximately 50%. The thicknesses of the Ta layer and the TaN layer are, for example, approximately 100 nm. Note that the common electrodes 14 and 14' that form the source electrodes 16 and the drain electrodes 18 are also formed over the AlGaN inactive region.

(2) Manufacturing Process

FIGS. 9A to 9I are cross sectional views that illustrate a process of forming an air-bridge wiring 12 according to the first embodiment.

Figure 9A:
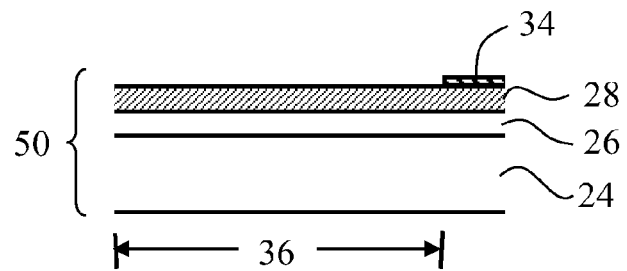
FIGS. 9A to 9I illustrate cross sectional views of a manufacturing process of an air-bridge wiring structure according to the first embodiment.
Figure 9B:
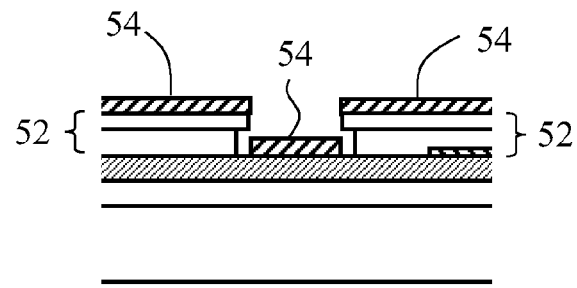

The UID-GaN channel layer 26, the n-type AlGaN carrier supply layer 28, and the UID-GaN cap layer (not shown) are laminated in turn over the SiC substrate 24, and the substrate 50 with the ohmic electrode 34 being formed thereover is prepared (see FIG. 9A). Here, the ohmic electrode 34 is formed over the semiconductor region that is intended to serve as the sources and the drains. Moreover, the UID-GaN cap layer is removed except for the semiconductor regions that are intended to serve as channels. In addition, the n-type AlGaN carrier supply layer 28 exposed on an area intended for forming the common electrode 14" becomes an AlGaN inactive region 36 having a high resistance by ion implantation.

A photo-resist film 52 for lift-off is formed over the substrate 50. Then, a Ni/Au laminated film 54 that is intended to serve as the gate electrodes 22 is deposited (see FIG. 9B). The photo-resist film 52 for lift-off is removed, and the gate electrode 22 is formed. The Ni/Au laminated film 54 forms a Schottky barrier on the UID-GaN cap layer (not shown).

Figure 9C:
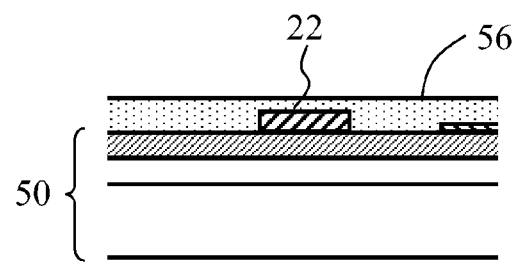

An SiN film 56, intended to serve as a protection film 32 and having a thickness of, for example, approximately 500 nm, is deposited over the substrate 50 (see FIG. 9C). The thickness of the protection film 32 is desirably, for example, 5 nm to 500 nm.

Figure 9D:
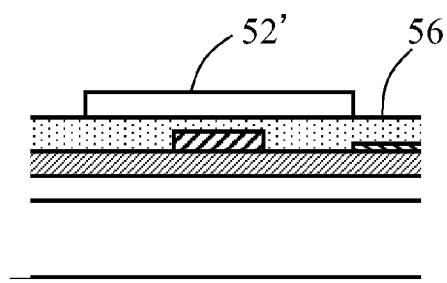
Figure 9E:
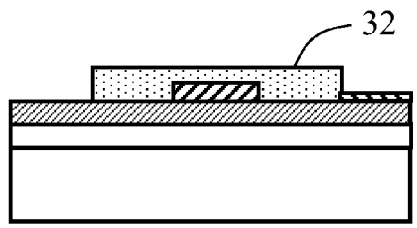

Thereafter, a photo resist film 52' is formed over an area intended for forming the protection film 32 (see FIG. 9D). Use of the photo-resist film 52' as an etching mask allows formation of the protection film 32 by removing the SiN film 56 with dry etching (see FIG. 9E).

Figure 9F:
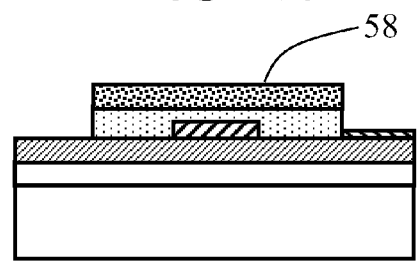

A photo-resist film (a mask) 58 for air-bridge formation is formed over the protection film 32 at the location where the intersection of the gate electrode and the source electrode is to be located (see FIG. 9F).

Figure 9G:
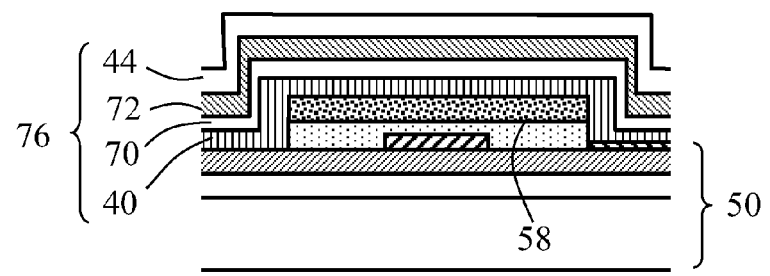

The Ti layer 40, the Ta layer 70, the TaN layer 72 (with, for example, a concentration of nitrogen of approximately 50%), and the first Au layer 44 are deposited in turn over the substrate 50 (see FIG. 9G). Here, the thicknesses of the Ti layer 40, the Ta layer 70, the TaN layer 72, and the first Au layer 44 are, for example, approximately 10 nm, approximately 100 nm, approximately 100 nm, and approximately 50 nm, respectively. Note that the Ti layer 40 is provided for promoting adhesiveness of the Ta/TaN laminated film and may be substituted by other metal layers, for example, a Cr layer.

The Ti layer 40, the Ta layer 70, and the first Au layer 44 are, for example, deposited with a sputtering method in which Ti, Ta, and Au, are used as targets, respectively. A sputter gas is, for example, Ar. On the other hand, the TaN layer 72 is, for example, deposited with a reactive sputtering method in which Ta is used as a target. A reactive gas is, for example, $N_2$. At this point of time, since the deposited TaN layer is thin enough and has a thickness of, for example, approximately 100 nm, the temperature of the substrate 50 may not increase above approximately 150° C. Therefore, the photo-resist film 58 for air-bridge formation may not melt.

Note that it may be possible to provide the photo-resist film 58 for air-bridge formation with a UV curing to make the cross section thereof more round before forming the Ti layer 40.

As the cross section of the photo-resist film 58 for air-bridge formation becomes more rectangular in shape, the coverage of a Ti/Ta/TaN/Au sputter film 76 becomes smaller.

Note that the "coverage" means the ratio of the thickness of a metal film deposited on the top surface of the resist to the thickness of the metal film deposited on side faces of the resist. Consequently, making the cross section of the photo resist film 58 for air-bridge formation more rounded in shape allows for easier formation of the air-bridge.

Using the first Au layer 44 as a seed film, the second and the third Au layers 46 and 48 are formed by electroplating using, as a plating mask, a photo-resist film (not shown) with openings for the areas for the source and drain electrodes.

Thicknesses of the second and the third Au layers 46 and 48 are, for example, 1 μm to 2 μm in total.

Figure 9H:
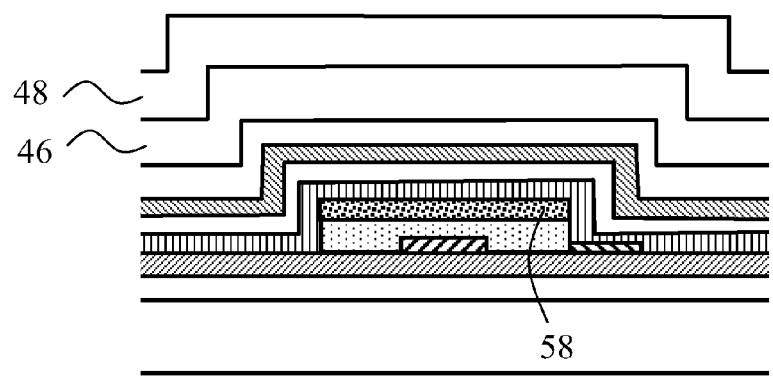

Thereafter, the plating mask is removed, and the sputter film being exposed between respective electrodes is removed by milling (FIG. 9H).

Figure 9I:
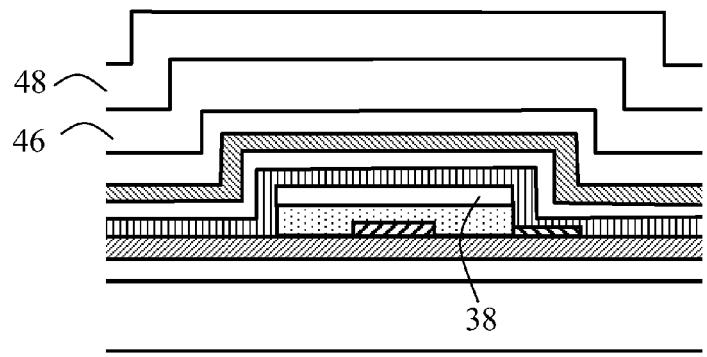

The photo-resist film 58 for the air-bridge formation is removed with a microwave asher to form the space 38, in which the reactive gas is, for example, oxygen (see FIG. 9I).

Here, since the Ta/TaN laminated layer is thick enough and has a thickness of approximately 200 nm, for example, the air-bridge wiring may not collapse even with the removal of the photo-resist film 58 for the air-bridge formation.

The method of manufacturing the multi-gate transistor 2 includes the process disclosed above.

Hereinafter, the method of manufacturing the multi-gate transistor 2 according to the first embodiment includes the following process.

According to the manufacturing method, the photo-resist film 58 for the air-bridge formation is formed over the substrate 50 where a semiconductor element (GaN-HEMT 4) is formed, and the photo-resist film 58 for the air bridge formation is coupled to the semiconductor element and linearly extends such that the top surface of a first wiring (the gate electrode 22) crossing the other wiring is covered at the location where the intersection is intended.

In addition, according to the manufacturing method, the titanium layer 40, the tantalum layer 70, the tantalum nitride layer 72, and the first gold layer 44 are laminated in turn, and a second wiring (the source electrode 16), electrically coupled to the semiconductor element and extending from one end of the photo-resist film 58 to the other end thereof such that a the second wiring crosses over the photo-resist film 58, is formed as the other wiring.

Moreover, according to the manufacturing method, the photo-resist film 58 is removed after forming the second wiring.

Here, the formation of the tantalum nitride layer 72 is completed before the photo-resist film 58 is melted.

(3) Electromigration Resistance

Next, the evaluation results of the electromigration resistance for the air-bridge wirings according to the first embodiment are disclosed.

The electromigration resistance was evaluated by a method similar to the accelerated thermal degradation test disclosed above.

Evaluation specimens used for the evaluation were created by laminating a Ti layer having a thickness of approximately 10 nm, a Ta layer having a thickness of approximately 100 nm, a TaN layer having a thickness of approximately 100 nm and a concentration of nitrogen of approximately 50%, and an Au layer having a thickness of approximately 50 nm to 300 nm in turn over the Ti/Al laminated film. The method of forming films with the Ti layer, the Ta layer, the TaN layer, and the Au layer is similar to, if not the same as, the method of forming the films disclosed above. On the other hand, the heating temperature is approximately 450° C.

Figure 10:
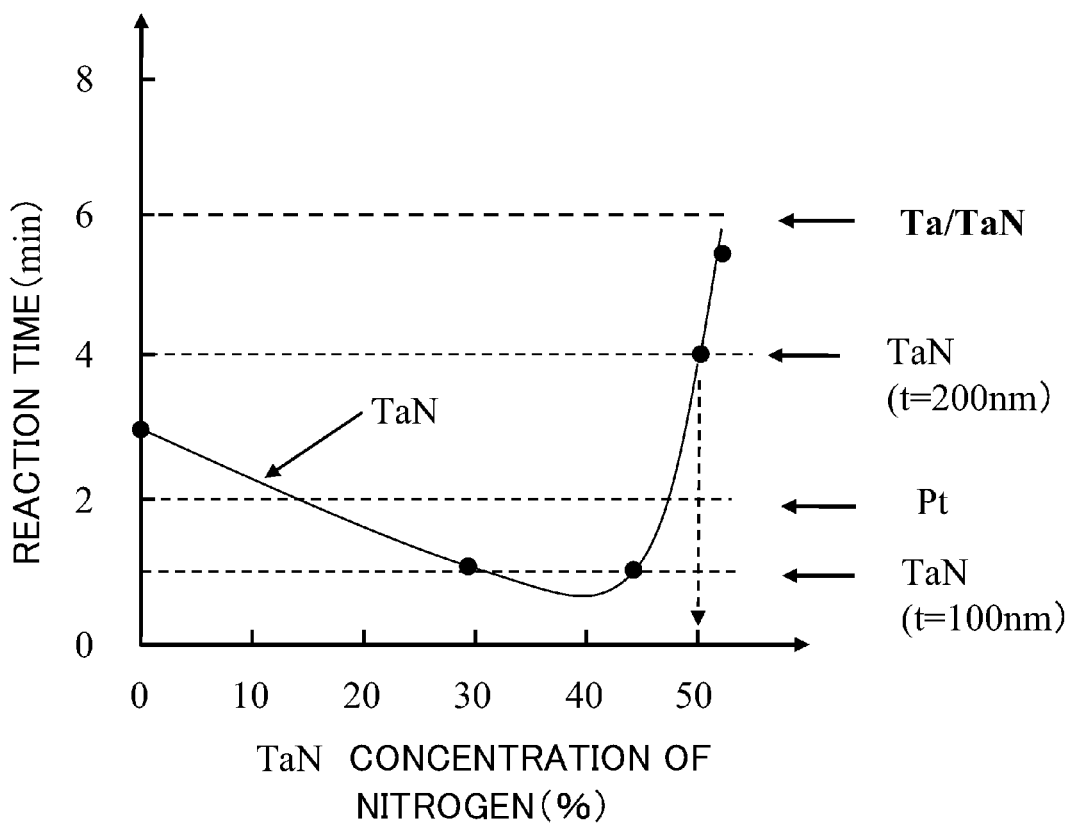
FIG. 10 is a graph representing results of accelerated thermal degradation tests implemented on a Ta/TaN laminated film according to the first embodiment.

FIG. 10 is a graph representing results of the accelerated thermal degradation tests of the first embodiment. For comparison, the graph of FIG. 10 represents the results of Ti/TaN/Au and Ti/Pt/Au (see FIG. 3) and the results of the first embodiment. The bold dotted line "Ta/Tan" represents the reaction time (approximately 6 minutes) of the above evaluation specimen where a Ti/Ta/TaN laminated film is formed between the Ti/Al laminated film and the Au layer (the thicknesses of the Ta layer and the TaN layer are approximately 100 nm, respectively.).

On the other hand, the curved line "TaN" represents the reaction time of the specimen where a Ti/Ta$_x$N$_{-x}$ laminated film ($0 \leq X < 1$) is formed between the Ti/Al laminated film and the Au layer (note that the thickness of the Ta$_x$N$_{1-x}$ layer is approximately 200 nm.).

In addition, the dotted line "TaN (t=200 nm)" represents the reaction time (approximately 4 minutes) of the specimen formed of the Ti/TaN laminated film in which the TaN layer having a thickness of approximately 200 nm and a concentration of nitrogen of approximately 50% is laminated over the Ti layer having a thickness of approximately 10 nm between the Ti/Al laminated film and the Au layer.

On the other hand, the dotted line "Pt" represents the reaction time (approximately 2 minutes) of the specimen where the Ti/Pt laminated film is formed between the Al layer and the Au layer (the thickness of the Pt layer is approximately 200 nm.).

Here, since the Ti layer is included each of the Ti/Ta/TaN laminated film, Ti/TaN laminated film, and Ti/Pt laminated film, the Ti layer does not cause differences in the reaction times. Hence, the metal layers that affect the differences in electromigration resistances of respective laminated films are the Ta/TaN laminated layer, TaN layer, and the Ti/Pt layer.

As is apparent from the graph of FIG. 10, the reaction time of the specimen where the Ti/Ta/TaN laminated film is formed is approximately 3 times longer than that of the specimen where Ti/Pt laminated film is formed, and approximately 1.5 times longer than that of the specimen where Ti/TaN (the thickness of approximately 200 nm) is formed.

These facts indicate that the electromigration resistance of the Ta/TaN laminated film surpasses that of the TaN layer having a thickness of approximately 200 nm, and the electromigration resistance of the Ta/TaN laminated film is much higher than that of the conventional Pt layer.

Note that the graph of FIG. 10 also represents the result of the accelerated thermal degradation test implemented on the Ti/TaN laminated film as the dotted line "TaN (t=100 nm)" where the TaN layer having a thickness of approximately 100 nm is laminated over the Ti layer. As represented in the graph of FIG. 10, the reaction time of the specimen where TaN having a thickness of approximately 100 nm is formed therein is approximately 1 minute, and this value is only a half of that of the specimen where the Pt layer having a thickness of approximately 200 nm is formed.

As disclosed above, the electromigration resistance of the Ta/TaN laminated film surpasses the electromigration resistance of the TaN layer having a similar, if not the same, film thickness. It may be assumed that, as a reason thereof, growth of the TaN layer over the Ta layer causes a layer structure (composition) of the TaN layer to change, and the density of the TaN layer is increased. For example, it may be assumed that the growth of the TaN layer over the Ta layer results in mixed growth of large and small TaN grains, so that the small TaN grains fill gaps among the large TaN grains, and as a result, the density of the TaN layer is increased.

(4) Operation

Hereinafter, an operation of the multi-gate transistor 2 according to the first embodiment will be disclosed.

To operate the multi-gate transistor 2, each of the electrodes is coupled in the following manner. The source electrode 16 of the multi-gate transistor 2 is electrically coupled to a ground. The drain electrode 18 is electrically coupled to a power supply via a load resistor. A signal is input to the gate electrode 22 in the above condition.

A signal voltage input to the gate electrode 22 is supplied to the gate 20 of each GaN-HEMT 4, and the input signal causes a drain current of the each GaN-HEMT 4 to vary based on a mutual conductance. The drain currents are supplied to the load resistor (the GaN-HEMT 4 according to the first embodiment is for example an n-channel field effect transistor) after being merged by the common electrode 14' (forming the drain electrode 18). (The GaN-HEMT 4 of this embodiment is an n-channel field-effect transistor.

Consequently, the current is supplied from the load resistor to the drain. In other words, the current is not a "drain current," but electron flows flowing from each of the drains are merged and supplied to the load resistor.)

Here, since the drain currents are merged by the common electrode 14', the amount of current flowing through the load resistor is made larger in proportion to the number of GaN-HEMTs 4 forming the multi-gate transistor 2.

At this point of time, the source currents of the respective GaN-HEMTs 4 are discharged to the ground after passing through the air-bridge wiring 12 and being merged by the common electrode 14. As a result, the current flowing through the air-bridge wiring 12 varies depending on the signal voltages applied to the gate. An average value of the currents flowing through the air-bridge wiring 12 exceeds, for example, approximately $1 \times 10^5$ A/cm$_2$.

However, the air-bridge wiring 12 is supported with a Ta/Tan laminated film 74 having a high electromigration resistance in the multi-gate transistor 2 according to the first embodiment. By virtue thereof, the possibility of disconnection of the air-bridge wiring 12 may be effectively reduced.

Meanwhile, a large current is caused to flow through each of the sources 6 of respective GaN-HEMTs 4. At that time, there is a possibility that electromigration may occur at the Au layer that forms the electrode 10' of the source electrode 16 and may cause a reaction with the Ti/Al ohmic electrode 34 provided over the source 6. However, as is apparent from the manufacturing process disclosed above, the Ta/TaN laminated film 74 having a high electromigration resistance is provided to separate the Au layers (the first to the third Au layers 44, 46, and 48) forming the electrode 10' and the Ti/Al ohmic electrode 34. Consequently, the possibility of reaction between both layers may be effectively reduced.

Furthermore, the resistance value of the Ta/TaN laminated film 42 is only approximately 60% of the resistance value of the TaN layer having a similar, if not the same, thickness.

Meanwhile, the signal voltage input to the gate electrode 22 propagates through the gate electrode 22 (the first wiring). The gate electrode 22 crosses the air-bridge wiring 12. However, since the space 38 separates both the gate electrode 22 and the air-bridge wiring 12, cross talk between both due to a parasitic capacitance is small. This fact is shared with the following embodiments disclosed hereinafter.

Since the parasitic capacitance is small, the multi-gate transistor 2 according to the first embodiment is capable of being operated at, for example, several GHz.

Second Embodiment

A second embodiment relates to a semiconductor device and a manufacturing method thereof where the Ta/TaN layer forming the air-bridge wiring 12 in the semiconductor device according to the first embodiment is substituted by a Ta/Ti/TaN laminated film with a concentration of nitrogen that is, for example, approximately 50%.

(1) Structure

A structure of the semiconductor (having the air-bridge wiring 12) according to the second embodiment is similar to, if not the same as, the semiconductor device disclosed in the first embodiment, except for a structure of the source electrode 16 and the drain electrode 18.

The source electrode 16 and the drain electrode 18 are formed concurrently as disclosed in the first embodiment. In consequence, the source electrode 16 and the drain electrode 18 include similar, if not identical, laminated structures. Therefore, the structure of the semiconductor device (the multi-gate transistor) according to the second embodiment will be disclosed hereinafter by especially referring to the air-bridge wiring 12 (that forms a part of the source electrode 16).

Figure 11:
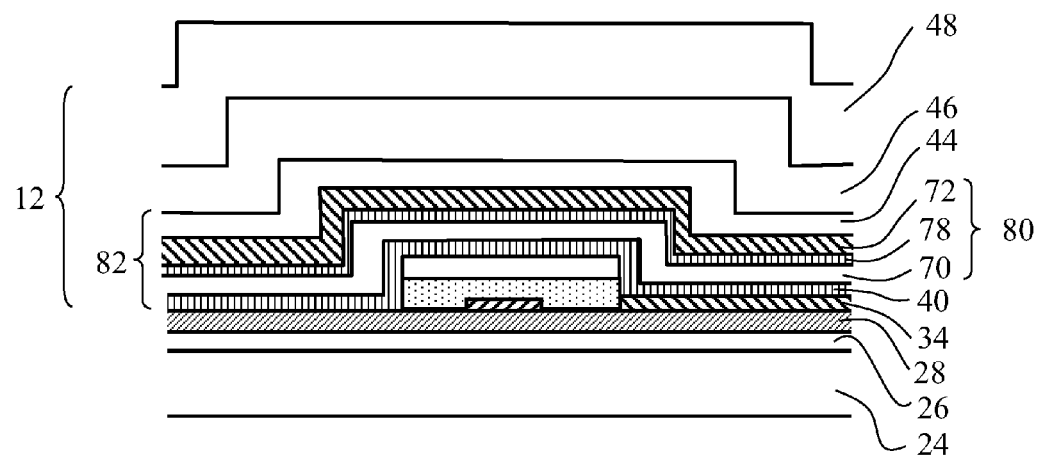
FIG. 11 illustrates a cross sectional view of an air-bridge wiring that forms a multi-gate transistor according to a second embodiment.

FIG. 11 illustrates a cross sectional view of the air-bridge wiring 12 that forms the multi-gate transistor according to the second embodiment.

The Ta/TaN layer 74 forming the air-bridge wiring 12 of the first embodiment is substituted with a Ta/Ti/TaN laminated film 80 in the air-bridge wiring 12 according to the second embodiment (see FIG. 11). Here, the Ta/Ti/TaN laminated film 80 is formed by lamination of the Ta layer 70, a Ti layer 78, and the TaN layer 72 in turn.

Moreover, the thicknesses of the Ta layer 70, the Ti layer 78, and the TaN layer 72 are, for example, approximately 100 nm, approximately 10 nm, and approximately 100 nm, respectively. The thicknesses of the other metal layers may be similar to, if not the same as, that of the corresponding metal layers of the multi-gate transistor 2 according to the first embodiment. Note that the concentration of nitrogen in the TaN layer is, for example, approximately 50%.

That is to say, in the multi-gate transistor according to the second embodiment, another Ti (titanium) layer 78 is provided between the Ta (tantalum) layer 70 and the TaN (tantalum nitride) layer 72 that form the air-bridge wiring 12 in the multi-gate transistor 2 according to the first embodiment.

(2) Manufacturing Process

The manufacturing process of the multi-gate transistor according to the second embodiment is similar to that of the multi-gate transistor 2 according to the first embodiment. Hereinafter, the manufacturing process that is different from that of the first embodiment will be disclosed.

The manufacturing process of the second embodiment is similar to, if not the same as, that of the first embodiment except that a Ti/Ta/Ti/TaN/Au sputter film 82 is formed instead of the Ti/Ta/TaN/Au sputter film 74. For example, the Ti layer 78 provided between the Ta layer 70 and the TaN layer 72 is formed with the sputtering method in which Ti is used as a target. The sputter gas may be, for example, Ar.

That is to say, in the semiconductor manufacturing method according to the second embodiment, the TaN (Tantalum nitride) layer is laminated after the other Ti (Titanium) layer has been laminated over the Ta (Tantalum) layer, based on the manufacturing method disclosed in the first embodiment.

(3) Electromigration Resistance

Next, the evaluation results of the electromigration resistance for the Ta/Ti/TaN laminated film 80 based on the accelerated thermal degradation test will be disclosed. Specimens used for the evaluations are specimens where the Ti/Ta/Ti/TaN/Au laminated film is laminated over the Ti/Al laminated film. Here, the thickness of the Au layer is, for example, 50 nm to 300 nm.

Figure 12:
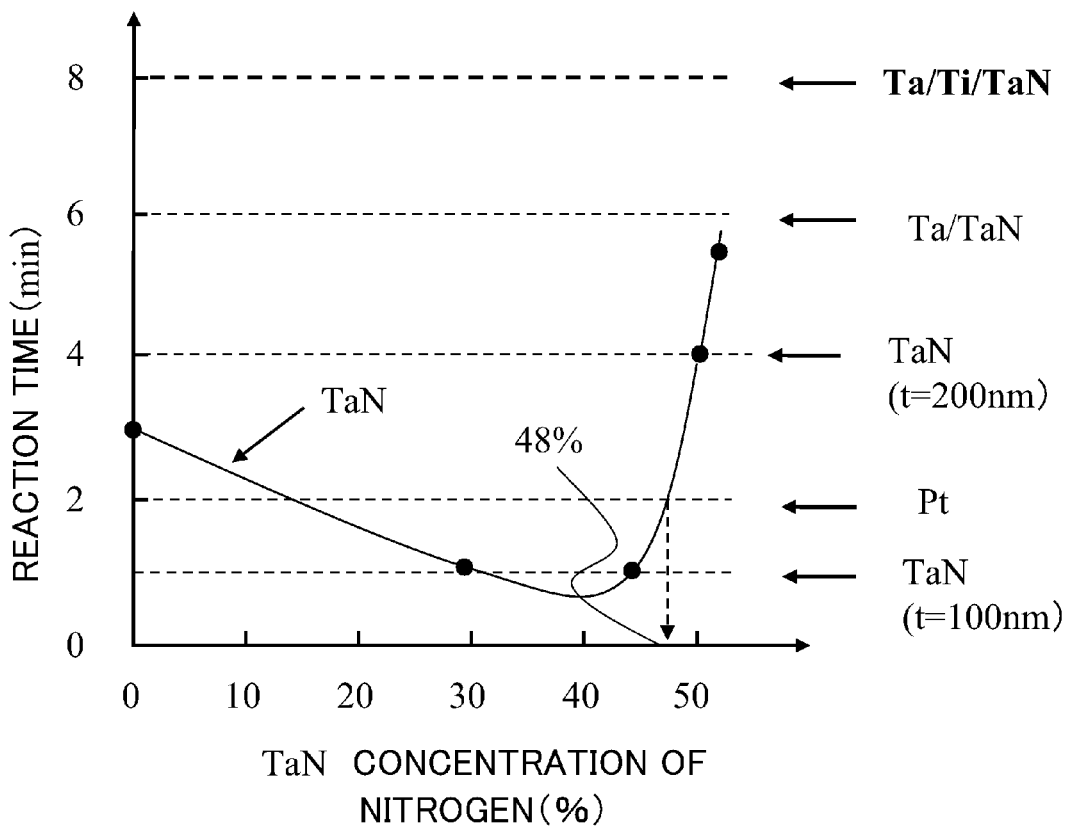
FIG. 12 is a graph representing results of accelerated thermal degradation tests implemented on a Ta/Ti/TaN laminated film according to the second embodiment.

FIG. 12 is a graph representing the results of the accelerated thermal degradation tests implemented on the Ta/Ti/TaN laminated film 80 according to the second embodiment. For comparison, the graph of FIG. 12 also represents the results of accelerated thermal degradation tests disclosed in FIGS. 3 and 10.

The bold dotted line "Ta/Ti/TaN" represents the reaction time (approximately 8 minutes) of the specimen where the Ta/Ti/TaN laminated film 80 according to the second embodiment is formed. As is apparent from the graph of FIG. 12, the reaction time of the specimen where the Ta/Ti/TaN laminated film 80 is formed is approximately four times longer than the specimen where the Pt layer is formed and approximately 1.3 times longer than the specimen where the Ta/TaN laminated film 74 according to the first embodiment is formed.

These facts reveal that the electromigration resistance of the Ta/Ti/TaN laminated film 80 surpasses that of the Ta/TaN laminated film 74 according to the first embodiment, and the electromigration resistance of the Ta/Ti/TaN laminated film 80 is high enough compared to that of the conventional Pt layer.

The reason why the electromigration resistance of the Ta/Ti/TaN laminated film 80 is higher than that of the Ta/TaN laminated film 74 according to the first embodiment is thought to be because the density of the TaN layer is increased by providing the Ti layer between the Ta layer and the TaN layer.

Note that the operation of the multi-gate transistor according to the second embodiment is similar to, if not the same as, the multi-gate transistor according to the first embodiment except that the electromigration resistance of the air-bridge wiring 12 becomes higher.

Third Embodiment

A third embodiment relates to a semiconductor device where the protection film covering the source electrode is removed under the air-bridge wiring in the semiconductor device according to the first embodiment and relates to a manufacturing method thereof.

(1) Structure

Figure 13:
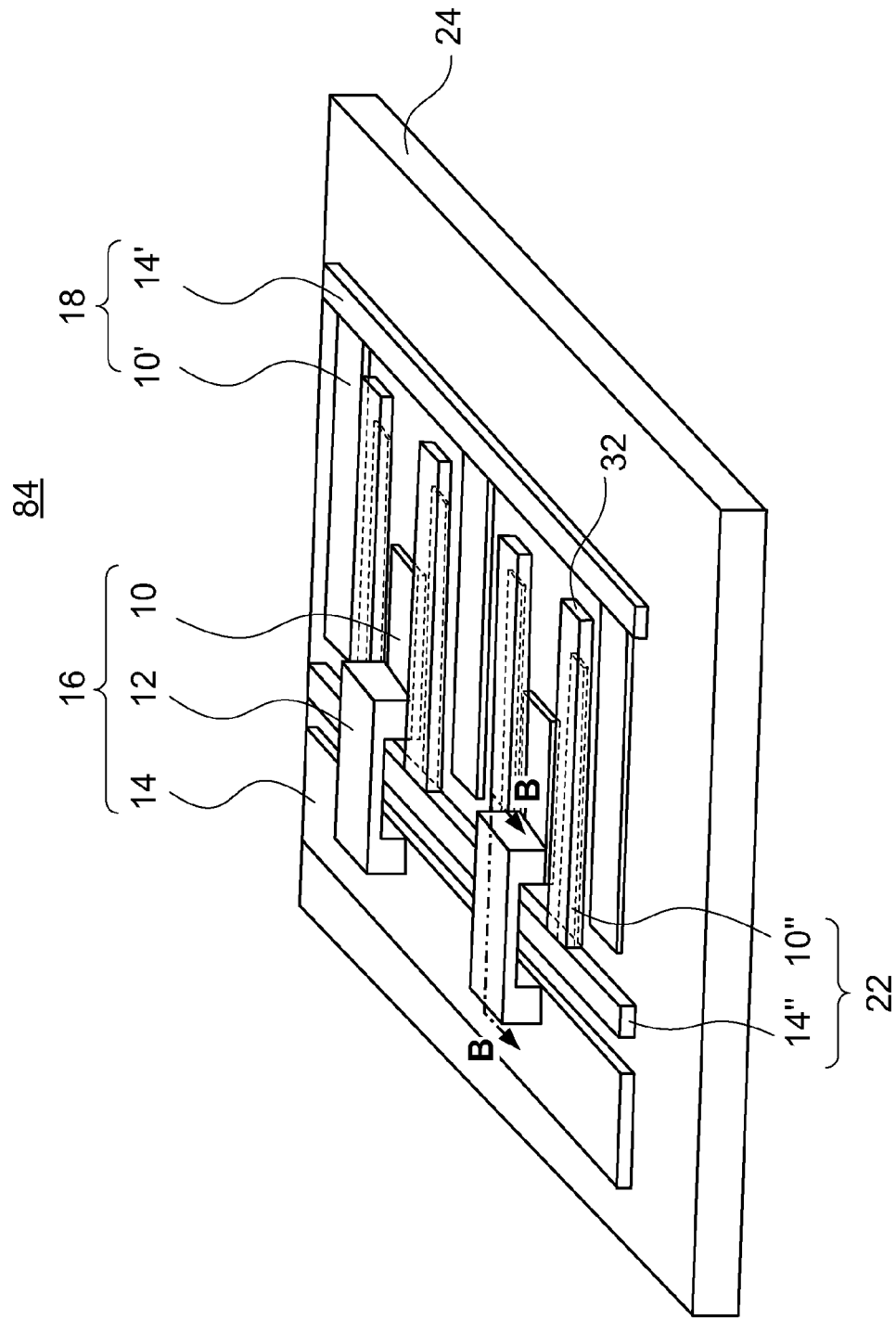
FIG. 13 illustrates a structural perspective view of a multi-gate transistor according to a third embodiment.
Figure 14:
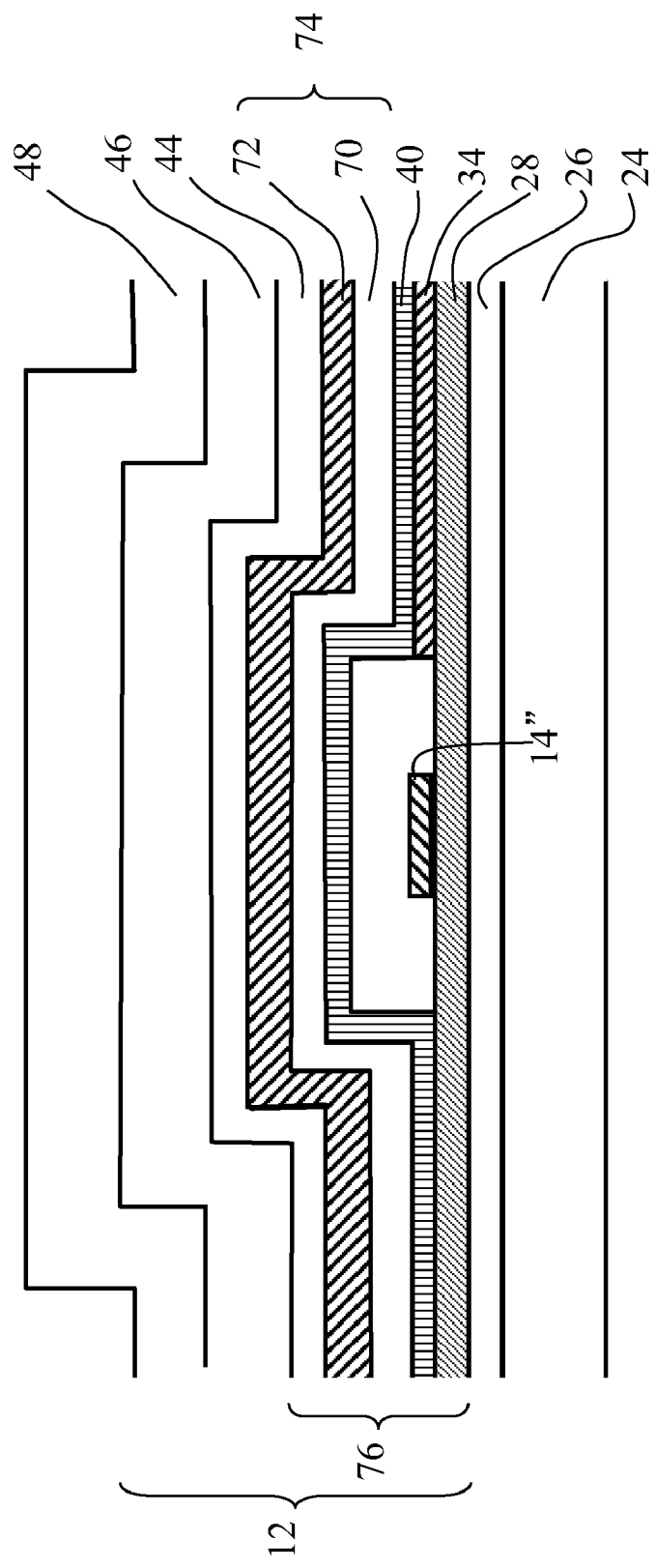
FIG. 14 illustrates a cross sectional view of the multi-gate transistor along the line B-B in FIG. 13.

FIG. 13 illustrates a perspective view of a multi-gate transistor 84 according to the third embodiment. FIG. 14 illustrates a cross sectional view that is viewed along the line B-B in FIG. 13 from the direction shown by the arrows.

As illustrated in FIG. 13, the multi-gate transistor 84 according to the third embodiment is different from the multi-gate transistor 2 according to the first embodiment in that the common electrode 14" that is included the gate electrode 22 is not covered with a protection film 32, that is to say, the common electrode 14" is exposed. Note that the common electrode 14" of the gate electrode 22 is provided under the air-bridge wiring 12.

The structure thereof is similar to, if not the same as, the multi-gate transistor 2 according to the first embodiment except for the common electrode 14". Thus, the description on the structure will be reduced or omitted except for that of the common electrode 14".

As illustrated in FIG. 6, the common electrode 14" is covered with the protection film 32 even under the air-bridge wiring 12, in the multi-gate transistor 2 according to the first embodiment. Consequently, there is a portion where a dielectric film, such as SiN or the like, is provided between the air-bridge wiring 12 and the common electrode 14". Due to the dielectric film, the parasitic capacitance between the source electrode 16, which includes the air-bridge wiring 12, and the gate electrode 22, which includes the common electrode 14", is made larger.

As illustrated in FIG. 13, the protection film 32, which is provided under the air bridge wiring 12 and covering the common electrode 14", is removed in the multi-gate transistor 84 according to the third embodiment, and a reduction in the parasitic capacitance may be achieved. That is to say, as illustrated in FIG. 14, the protection film (SiN film) is removed at the portion where a first wiring (the source electrode 16 that includes the air-bridge wiring 12) crosses over a second wiring (a gate electrode 22 that includes the common electrode 14").

For the above reason, signal interference between the gate electrode 22 and the source electrode 16 may become smaller in the multi-gate transistor 84 according to the third embodiment. Therefore, the multi-gate transistor 84 according to the third embodiment is capable of operating faster than the multi-gate transistor 2 according to the first embodiment.

The protection film 32 serves to protect the gate electrode 22 from contamination by dust and reduce, if not prevent, degradation of the output signals (drain current waveforms). However, a Ni/Au electrode 10" that is included in the gate 20 may be covered with the protection film 32 so as to reduce, if not prevent, the degradation of the output signals. Hence, the degradation of the output signals may not occur even if the protection film 32 covering the common electrode 14" is removed as disclosed in the third embodiment.

Note that the Ni/Au common electrode 14" is covered with the protection film 32 and this serves to protect a Ni layer forming the common electrode 14" from oxidation in the multi-gate transistor 2 according to the first embodiment.

In addition, note that the Ta/TaN layer that forms the air-bridge wiring 12 may be substituted with Ta/Ti/TaN laminated film, as disclosed in the second embodiment.

(2) Manufacturing Process

FIGS. 15A to 15D illustrate cross sectional views that indicate a manufacturing process of forming the protection film 32 to the air-bridge wiring 12 according to the third embodiment.

Here, FIGS. 15A to 15D are views along the line B-B in FIG. 13 from the direction shown by the arrows that illustrate the progress of the manufacturing process.

As disclosed hereinafter, the manufacturing process according to the third embodiment is similar to, if not the same as, the manufacturing process according to the first embodiment except for formation of the protection film and the photo-resist film (mask) for air-bridge formation.

The substrate 50 is prepared where the plural GaN-HEMTs 4 that is included in the multi-gate transistor 84, which include ohmic electrodes, are formed.

Next, the gate electrode 22, for example Ni/Au gate electrode 22, is formed.

These processes are similar to, if not the same as, the corresponding processes in the first embodiment and detailed description will be reduced or omitted.

First, a SiN film having a thickness of, for example, approximately 500 nm and prepared for serving as the protection film 32 is deposited over the SiC substrate 24 where the gate electrode 22 has been formed. Here, the preferable thickness of the SiN film is, for example, approximately 5 nm to 500 nm.

Thereafter, the photo-resist film is formed over an area intended for forming the protection film. Here, the third embodiment is different from the first embodiment in that the common electrode 14" is not covered with the photo-resist film.

The SiN film is removed by dry etching where the photo-resist film serves as an etching mask, and the protection film 32 is formed (see FIG. 13).

In consequence, the protection film (SiN film) is removed at the area intended for forming an intersection where the source electrode 16 (the second wiring) crosses the gate electrode 22 (the first wiring). In other words, the protection film (SiN film) is removed under the area where formation of the air-bridge wiring 12 is to be located. (see FIG. 15A).

Next, the photo-resist film 58 for air-bridge formation, which extends linearly such that the top surface and the side faces of the shared electrode 14" are covered, is formed over the substrate 24.

Figure 15A:
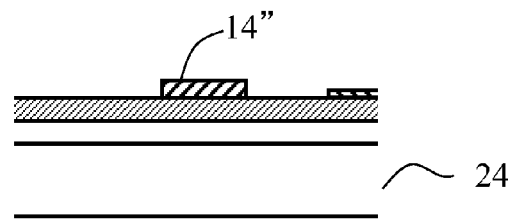
FIGS. 15A to 15D illustrate cross sectional views indicating a manufacturing process of the multi-gate transistor according to the third embodiment.
Figure 15B:
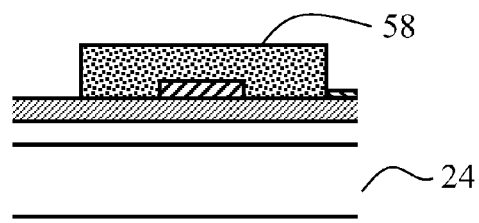
Figure 15C:
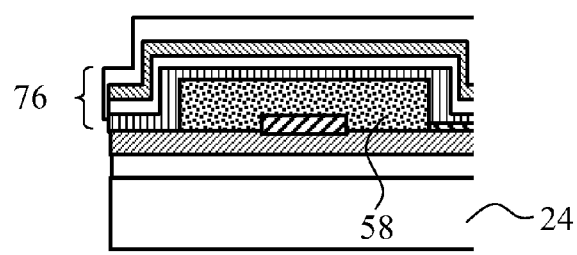

Then, as illustrated in FIG. 15C, the Ti/Ta/TaN/Au sputter film 76 (here, concentration of nitrogen in TaN is, for example, approximately 50%.) is formed over the substrate 24 where the photo-resist film 58 for air-bridge formation has been formed.

Then, the second and the third Au layers 46 and 48 are formed over the Ti/Ta/TaN/Au sputter film 76 for example by a plating method.

Figure 15D:
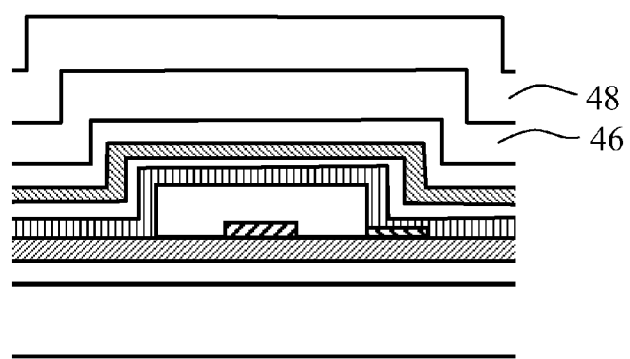

Then, as illustrated in FIG. 15D, the photo-resist film 58 for air-bridge formation is removed, and the multi-gate transistor 84 is formed.

(3) Operation

Operations of the multi-gate transistor 84 according to the third embodiment are substantially similar to, if not the same as, those of the multi-gate transistor 2 according to the first embodiment. Note, however, that the multi-gate transistor 84 according to the third embodiment operates with higher frequencies in comparison to the multi-gate transistor 2 according to the first embodiment because the parasitic capacitance between the source electrode 16 and the gate electrode 22 is smaller than that of the multi-gate transistor 2.

Fourth Embodiment

A fourth embodiment relates to a high frequency amplifier provided with the multi-gate transistors according to the first to the third embodiments.

Figure 16:
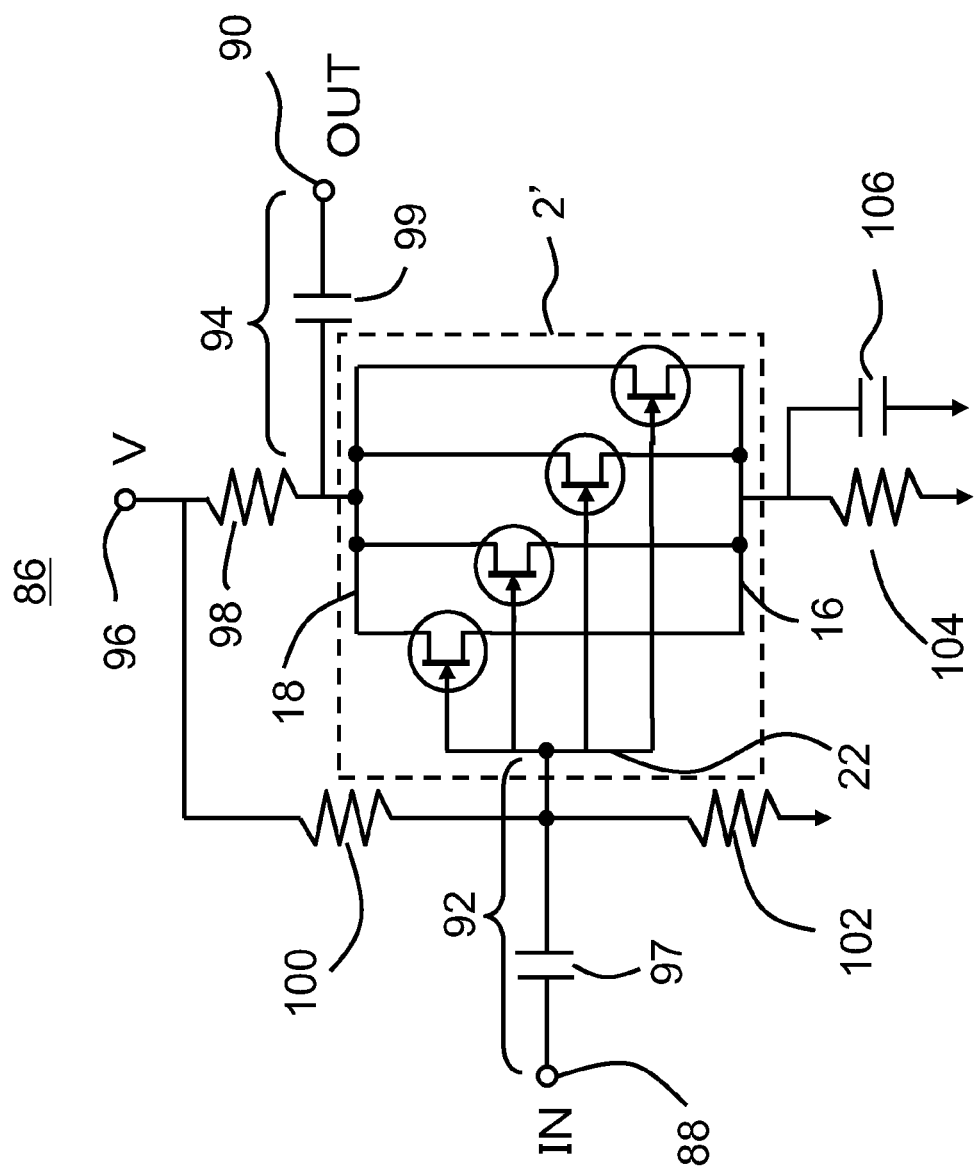
FIG. 16 illustrates a circuit diagram of a high frequency amplifier according to a fourth embodiment.

FIG. 16 illustrates a circuit diagram of the high frequency amplifier according to the fourth embodiment.

The high frequency amplifier 86 according to the fourth embodiment includes any of the multi-gate transistors disclosed in the first to the third embodiments as a multi-gate transistor 2'.

In addition, the high frequency amplifier 86 according to the fourth embodiment includes a first terminal (an input terminal 88) to which an electrical signal is input and a second terminal (an output terminal 90) from which an amplified electrical signal is output.

Moreover, the high frequency amplifier 86 according to the fourth embodiment is provided with a first path 92 through which the electrical signal propagates from the first terminal (the input terminal 88) to the first wiring (the gate electrode 22). Furthermore, the high frequency amplifier 86 according to the fourth embodiment is provided with a second path 94 through which the electrical signal propagates from a third wiring (the drain electrode 18), electrically coupled to the drain 8, to the second terminal (the output terminal 90).

Here, the first path 92 is provided with a first capacitor 97, and the second path 94 is provided with a second capacitor 99. In consequence, only a high frequency signal propagates through the first and the second paths 92 and 94.

In addition, the high frequency amplifier 86 according to the fourth embodiment includes a third terminal (power supply terminal 96) coupled to a power supply voltage. In addition, the power supply terminal 96 is coupled to the second wiring (the drain electrode 18) through a first resistor 98.

Moreover, the power supply terminal 96 is coupled to a coupling point provided between the first capacitor 97 and the first wiring (the gate electrode 22) through a second resistor 100. Furthermore, the coupling point is coupled to the groundplane through a third resistor 102. Here, the second and the third resistors 100 and 102 make settings of bias points for the multi-gate transistor 2'.

On the other hand, the source electrode 16 is coupled to the ground plane through a circuit where a fourth resistor 104 and a third capacitor 106 are coupled in parallel.

Here, the multi-gate transistor 2' is included in a given package and disposed over a printed board along with the first to the fourth resistors and the first to the third capacitors.

The high frequency amplifier 86 as described above operates in the following manner. When an electrical signal is input to the first terminal 88, the electrical signal propagates through the first path 92 and reaches the gate electrode of the multi-gate transistor 2'. The multi-gate transistor 2' operates as disclosed in respective embodiments and amplifies the input electrical signal. The amplified electrical signal propagates through the second path 94, and the amplified electrical signal is output from the second terminal 90.

Since the high frequency amplifier 86 according to the fourth embodiment is provided with the multi-gate transistor 2' according to the first to the third embodiments, disconnection of the air-bridge wiring may be effectively reduced, if not prevented, even if the high frequency amplifier 86 is operated with a large current.

Note that the circuit disclosed with reference to FIG. 16 is merely one example of the high frequency amplifier that makes use of a multi-gate transistor according to the first to the third embodiments.

Fifth Embodiment

A fifth embodiment relates to a transmitter provided with the high frequency amplifier according to the fourth embodiment.

Figure 17:
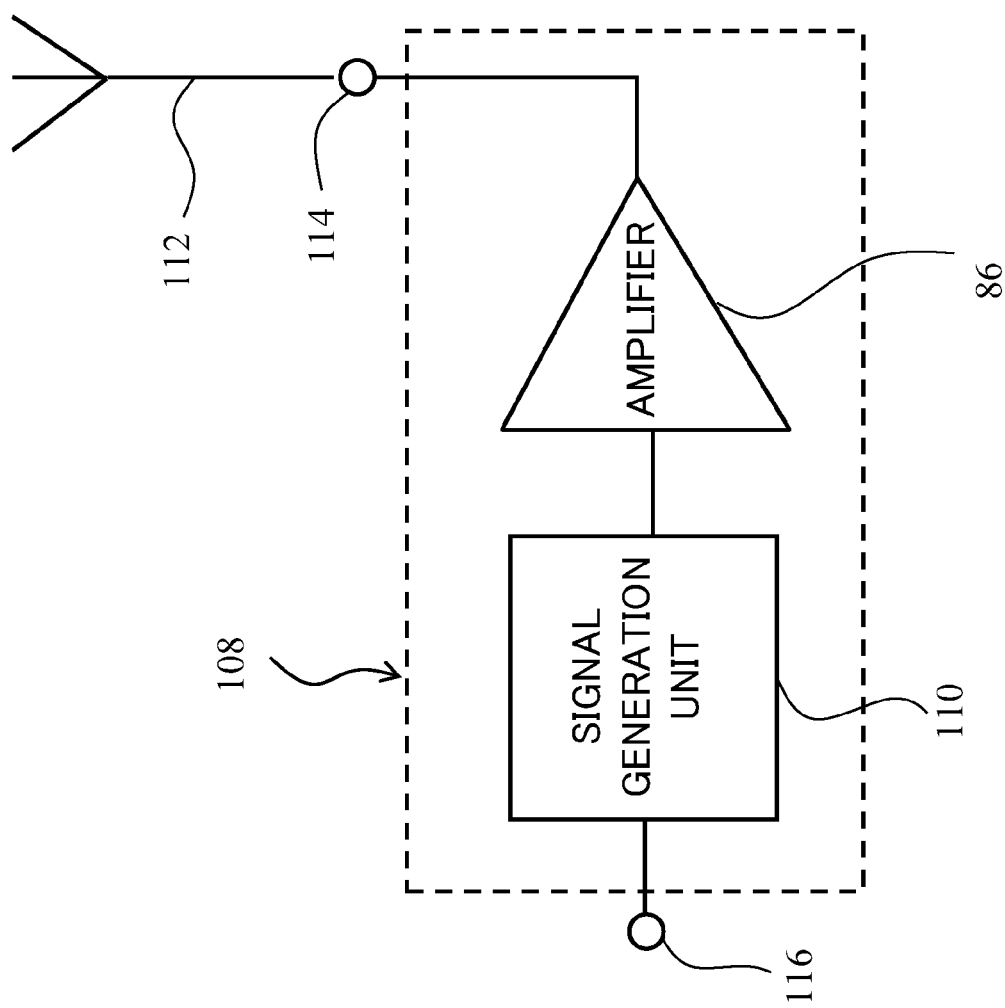
FIG. 17 illustrates a block diagram of a transmitter according to a fifth embodiment.

FIG. 17 illustrates a block diagram of a transmitter 108 according to the fifth embodiment.

A radio transmitter 108 according to the fifth embodiment is provided with an input terminal 116 to which an electrical signal is input and an output terminal 114 to which an antenna 112 is coupled, and the high frequency amplifier 86 according to the fourth embodiment, as illustrated in FIG. 17. Moreover, the radio transmitter 108 according to the fifth embodiment is provided with a high frequency signal generation unit 110 (for example, a voltage controlled oscillator [VCO]) that generates and outputs a modulated high frequency signal based on the input signal.

Moreover, the input terminal 116 is coupled to an input terminal of the high frequency signal generation unit 110 in the radio transmitter 108 according to the fifth embodiment. In addition, an output terminal of the high frequency signal generation unit 110 is coupled to a first terminal (the input terminal 88) of the high frequency amplifier 86 and the output terminal 114 is coupled to a second terminal (the output terminal 90) of the high frequency amplifier 86.

The transmitter 108 operates in the following manner. The electrical signal input from the input terminal 116 is supplied to the high frequency signal generation unit 110. The high frequency generation unit 110 generates the high frequency signal modulated based on the input electrical signal and supplies the high frequency amplifier 86 with the modulated high frequency signal. The high frequency amplifier 86 amplifies the supplied high frequency signal and supplies the antenna 112 coupled to the output terminal 114 with the amplified high frequency signal.

Here, since the transmitter 108 is provided with the high frequency amplifier 86 according to the fourth embodiment, a high-power signal may be supplied to the antenna. The transmitter according to the fifth embodiment may be, for example, used for base stations of mobile telephone systems.

[Modifications]

The concentration of nitrogen in the TaN layer is, for example, approximately 50% in the respective embodiments disclosed above. However, the concentration of nitrogen is not limited to the value disclosed above. The concentration of nitrogen in the TaN layer may preferably be more than 48% and less than 52%, or, more preferably, may be from 49% or higher to 51% or less.

As is apparent from the graph of FIG. 12, if the concentration of nitrogen is more than 48%, the electromigration resistance of a Ta/Ta$_x$N$_{1-x}$ laminated film (or a Ta/Ti/Ta$_x$N$_{1-x}$ laminated film) is higher than the electromigration resistance of conventional Pt layers. Hence, the concentration of nitrogen may preferably be more than 48%. On the other hand, the higher the concentration of nitrogen, the more difficult the formation of the TaN film will be. For example, it may be difficult to form a TaN film whose concentration of nitrogen is equal to or above 52%. Therefore, the concentration of nitrogen in TaN is preferably equal to or less than 52%.

The protection film is formed with silicon nitride in the respective embodiments disclosed above. Note, however, that insulation films, intended for the protection film, may not be limited to the silicon nitride (SiN) film. For example, the protection film may be formed with silicon dioxide (SiO$_2$).

The air-bridge wirings are provided over the source electrode in the respective embodiments disclosed above. However, it may be preferable that the air-bridge wirings are provided over the drain electrode if the drain electrode crosses the gate electrode. That is to say, the second wiring may be coupled to the drain instead of the source of the field effect transistor. Moreover, the air-bridge wirings according to the modification may be formed over wirings other than the source electrode and the drain electrode.

The multi-gate transistors are formed with the GaN-HEMTs in the respective embodiments disclosed above. However, the multi-gate transistor may be formed with the other field effect transistors such as an InP-HEMT provided with a semi-insulating InP as a substrate, an InGaAs channel layer, or an InAlAs barrier layer into which Si is doped.

Moreover, the air-bridge wirings according to the respective embodiments disclosed above may be applicable to semiconductor devices other than the multi-gate transistor, for example, field effect transistors provided with a plurality of gates.

Furthermore, the semiconductor elements that form the semiconductor devices according to the respective embodiments are field effect transistors. However, the semiconductor elements may be semiconductor elements other than field effect transistors, for example, bipolar transistors. If a bipolar transistor is used as the semiconductor element disclosed above, for example, the first wiring is coupled to a base and the second wiring is coupled to an emitter or a collector.

Moreover, although the gate electrode is formed of the Ni/Au laminated film in the respective embodiments disclosed above, the gate electrode may be formed of other laminated films. In addition, although the insulation film is etched by the dry-etching so that the protection film is formed in the respective embodiments disclosed above, the insulation film may be etched by other etching methods, such as wet-etching, ion milling, or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
   a first wiring extending in a first direction; and
   a second wiring extending in a second direction which crosses the first direction and being disposed with a space interposed between the first wiring and the second wiring, and including a tantalum layer, a tantalum nitride layer formed over the tantalum layer, and a metal layer formed over the tantalum nitride layer, wherein the first wiring and the second wiring are not electrically coupled with each other.

2. The semiconductor device according to claim 1, wherein the concentration of nitrogen in the tantalum nitride layer is more than 48% and equal to or less than 52%.

3. The semiconductor device according to claim 1 further comprising:
   a titanium layer formed between the tantalum layer and the tantalum nitride layer.

4. The semiconductor device according to claim 1 further comprising:
   a semiconductor element,
   wherein the first wiring and the second wiring are coupled to the semiconductor element and a signal input to the semiconductor element propagates through the first wiring.

5. The semiconductor device according to claim 4 further comprising:
   a protection film which covers the first wiring.

6. The semiconductor device according to claim 5, wherein the protection film is removed at a portion where the first wiring crosses the second wiring.

7. The semiconductor device according to claim 5, wherein the protection film is a silicon nitride film or a silicon dioxide film.

8. The semiconductor device according to claim 4, wherein the semiconductor element is a plurality of transistors,
   each of a plurality of sources, gates, and drains of each of the plurality of transistors extends in the same direction,
   each of the plurality of transistors shares at least one of the source and the drain with a plurality of adjacent transistors,
   the first wiring is electrically coupled to at least one of the plurality of gates, and
   the second wiring is electrically coupled to either the source or the drain.

9. The semiconductor device according to claim 8, wherein the transistor includes gallium nitride as a channel layer.

10. An amplifier comprising:
    a first wiring extending in a first direction;
    a second wiring extending in a second direction which crosses the first direction and being disposed with a space interposed between the first wiring and the second wiring, and including a tantalum layer, a tantalum nitride layer formed over the tantalum layer, and a metal layer formed over the tantalum nitride layer, wherein the first wiring and the second wiring are not electrically coupled with each other,
    a plurality of transistors to which the first wiring and the second wiring are coupled;
    a third wiring;
    a first terminal which is electrically coupled to the first wiring and to which an electrical signal is input;
    a second terminal which is electrically coupled to the third wiring and to which the amplified electrical signal is output,
    wherein each of a plurality of sources, gates, and drains of each of the plurality of transistors extends in a same direction,
    each of the plurality of transistors shares at least one of the source and the drain with a plurality of adjacent transistors,
    the first wiring is electrically coupled to the gate,
    the second wiring is electrically coupled to the source, and
    the third wiring is electrically coupled to the drain.

11. A radio transmitter comprising:
    an amplifier;
    a signal generation unit which generates and outputs a signal modulated based an input signal;
    an input terminal to which an electrical signal is input;
    an output terminal to which an antenna is coupled, wherein the amplifier comprises:
    a first wiring extending in a first direction,
    a second wiring extending in a second direction which crosses the first direction and being disposed with a space interposed between the first wiring and the second wiring, and including a tantalum layer, a tantalum nitride layer formed over the tantalum layer, and a metal layer formed over the tantalum nitride layer, wherein the first wiring and the second wiring are not electrically coupled with each other,
    a plurality of transistors to which the first wiring and the second wiring are coupled,
    a third wiring,
    a first terminal which is electrically coupled to the first wiring and to which an electrical signal is input, and
    a second terminal which is electrically coupled to the third wiring and to which the electrical signal amplified is output; and wherein
    each of a plurality of sources, gates, and drains of each of the plurality of transistors extends in a same direction,
    each of the plurality of transistors shares at least one of the source and the drain with the plurality of adjacent transistors,
    the first wiring is electrically coupled to at least one of the plurality of gates,
    the second wiring is electrically coupled to the source,
    the third wiring is electrically coupled to the drain,
    the input terminal is coupled to an input terminal of the signal generation unit,
    an output terminal of the signal generation unit is coupled to the first terminal, and
    the output terminal is coupled to the second terminal.

12. A semiconductor device manufacturing method comprising:
    forming a first wiring extending in a first direction over a semiconductor substrate;
    forming a mask over the first wiring;

laminating a tantalum layer, a tantalum nitride layer, and a metal layer in turn over the mask and forming a second wiring extending in a second direction which crosses the first direction;

removing the mask after forming the second wiring, wherein a film formation of the tantalum nitride layer is completed before the mask is melted.

13. The semiconductor device manufacturing method according to claim 12, wherein the concentration of nitrogen in the tantalum nitride layer is more than 48% and equal to or less than 52%.

14. The semiconductor device manufacturing method according to claim 12, wherein a titanium layer is laminated over the tantalum layer and thereafter the tantalum nitride layer is laminated over the titanium layer.

15. The semiconductor device manufacturing method according to claim 12, wherein the tantalum layer is formed by a sputtering method in which tantalum is used as a target, and the tantalum nitride layer is formed by a reactive sputtering method, in which tantalum is used as a target.

16. The semiconductor device manufacturing method according to claim 12, wherein the tantalum layer is formed by a sputtering method in which tantalum is used as a target, the tantalum nitride layer is formed by a reactive sputtering method in which tantalum is used as a target and nitrogen is used as a reactive gas, and the metal layer is formed of a first gold layer and a second gold layer, the first gold layer being formed by a sputtering method in which gold is used as a target, and the second gold layer being laminated by a plating method.

17. The semiconductor device manufacturing method according to claim 12, wherein the first wiring and the second wiring are coupled to a semiconductor element, and the first wiring is the wiring through which a signal input to the semiconductor element propagates.

18. The semiconductor device manufacturing method according to claim 12 further comprising:

covering the first wiring with a protection film before the mask is formed.

19. The semiconductor device manufacturing method according to claim 18 further comprising:

removing the protection film under the second wiring before the mask is formed.

20. The semiconductor device manufacturing method according to claim 18, wherein the protection film is either a silicon nitride film or a silicon dioxide film.

\* \* \* \* \*